United States Patent
Fujii et al.

(10) Patent No.: US 6,700,434 B2
(45) Date of Patent: Mar. 2, 2004

(54) SUBSTRATE BIAS VOLTAGE GENERATING CIRCUIT

(75) Inventors: Nobuyuki Fujii, Tokyo (JP); Fukashi Morishita, Tokyo (JP); Mihoko Akiyama, Tokyo (JP); Akira Yamazaki, Tokyo (JP); Mako Kobayashi, Hyogo (JP); Yasuhiko Taito, Tokyo (JP)

(73) Assignees: Mitsubishi Denki Kabushiki Kaisha, Tokyo (JP); Mitsubishi Electric Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/879,914

(22) Filed: Jun. 14, 2001

(65) Prior Publication Data

US 2002/0017946 A1 Feb. 14, 2002

(30) Foreign Application Priority Data

Aug. 14, 2000 (JP) ........................ 2000-246013

(51) Int. Cl.[7] .............................................. G05F 1/575
(52) U.S. Cl. ......................... 327/534; 327/536; 331/46
(58) Field of Search ................... 327/536, 537, 327/148, 157, 534, 535; 363/59, 60; 331/46, 49, 57, 74

(56) References Cited

U.S. PATENT DOCUMENTS

| | | | | |
|---|---|---|---|---|
| 5,208,557 A | * | 5/1993 | Kersh, III | 327/534 |
| 5,877,651 A | * | 3/1999 | Furutani | 327/537 |
| 5,999,009 A | * | 12/1999 | Mitsui | 324/765 |
| 6,154,411 A | * | 11/2000 | Morishita | 365/226 |
| 6,278,316 B1 | * | 8/2001 | Tanzawa et al. | 327/536 |
| 6,337,595 B1 | * | 1/2002 | Hsu et al. | 327/538 |
| 6,400,216 B1 | * | 6/2002 | Kim et al. | 327/536 |

FOREIGN PATENT DOCUMENTS

| | | |
|---|---|---|
| JP | 59-162690 A | 9/1984 |
| JP | 1-243288 A | 9/1989 |
| JP | 2-290051 A | 11/1990 |

* cited by examiner

*Primary Examiner*—Timothy P. Callahan
*Assistant Examiner*—Terry L. Englund
(74) *Attorney, Agent, or Firm*—Leydig, Vit & Mayer, Ltd.

(57) ABSTRACT

Oscillation outputs which are different for respective detector signals output from a first detector circuit and a second detector circuit, are obtained from a first ring oscillator and a second ring oscillator respectively corresponding to the detector circuits. A selector selects and outputs one of the oscillation outputs. Accordingly, it is sufficient to provide only one pump circuit in a circuit producing a substrate bias voltage.

15 Claims, 24 Drawing Sheets

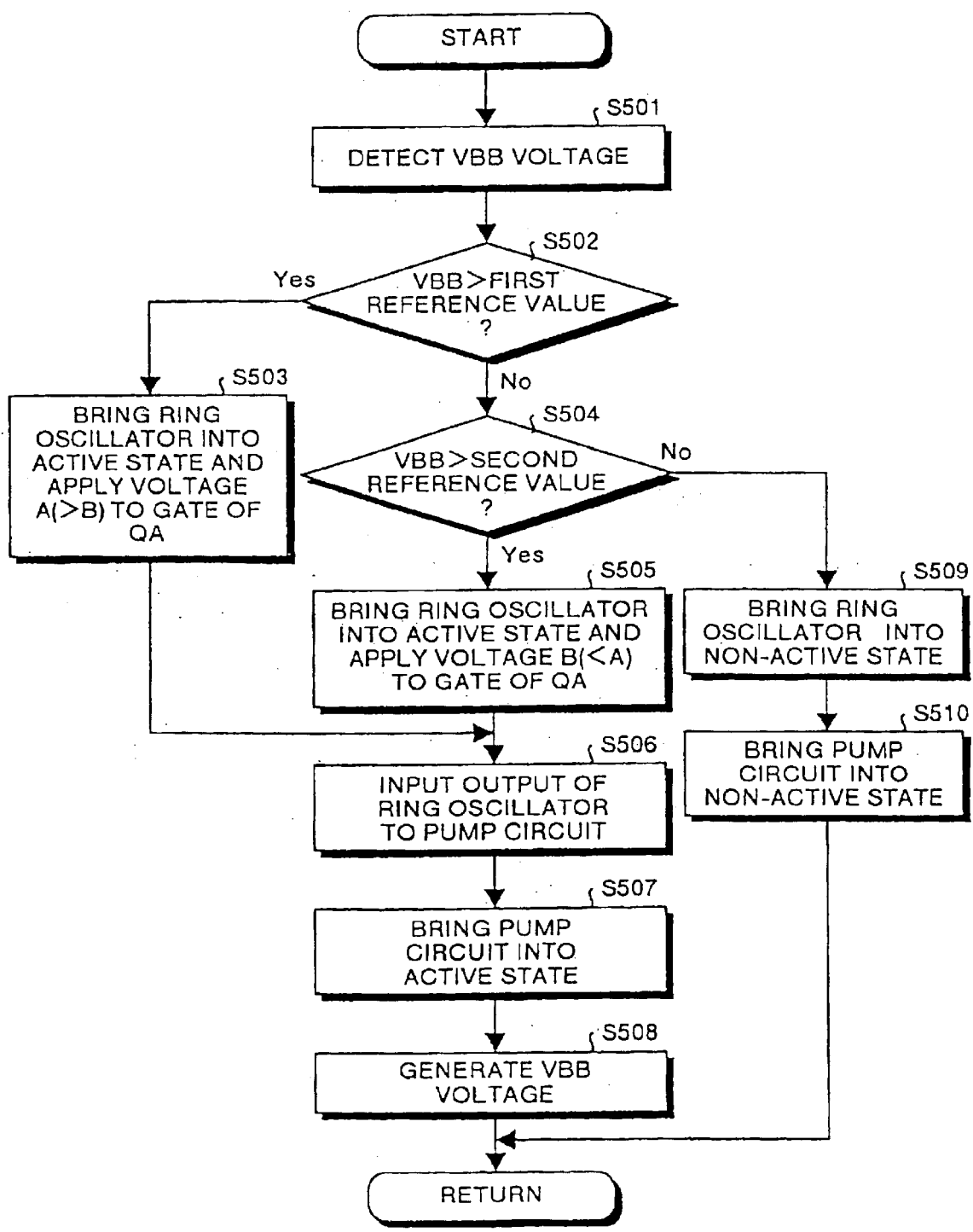

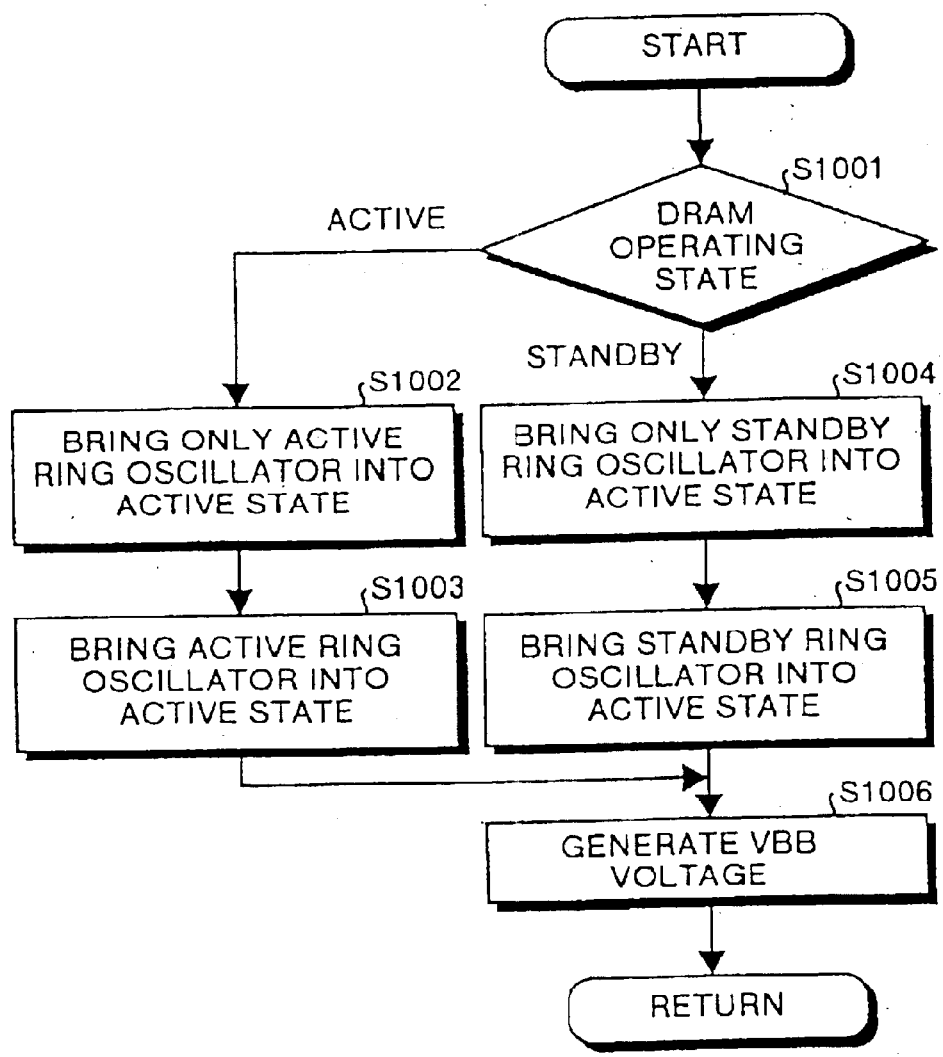

SUBSTRATE BIAS VOLTAGE GENERATING CIRCUIT

FIELD OF THE INVENTION

The present invention relates to a substrate bias voltage generating circuit which is applicable to a semiconductor memory.

BACKGROUND OF THE INVENTION

In general, a back bias voltage (VBB voltage, hereinafter) of a semiconductor the memory is generated as a voltage lower than a low voltage power source which is required for activating the semiconductor memory, and the VBB voltage is used for the following reasons:

Firstly, if a VBB voltage is applied, i.e., if the substrate-side memory is lowered in voltage, it is possible to prevent a positive/negative junction in a memory chip from being partially biased by a forward voltage, and to prevent data in a memory cell from being destroyed and to prevent the latch-up phenomenon.

Secondly, a variation in threshold voltage of a MOS transistor caused by bulk effects can be reduced to stabilize an operating state of the circuit. That is, if the VBB voltage is applied, it is possible to reduce the magnitude of variation in the threshold voltage caused by a variation in source potential. This means that a rising width of a word line can be reduced, and reliability of the device can be enhanced.

Thirdly, if the VBB voltage is applied, it is possible to increase a threshold voltage of a parasitic MOS transistor. If the threshold voltage of the parasitic MOS transistor is increased, junction breakdown voltage is improved and the current is reduced.

Fourthly, if the VBB voltage is applied, it is possible to reduce the capacitance of a positive/negative junction formed between an $N^+$ source drain region and a P well region of an NMOS transistor. With this effect, the circuit operation speed is increased, a parasitic capacitance on a bit line is reduced, and the capacity of cell data transmitted to the bit line is increased.

As described above, the substrate bias voltage generating circuit for generating a VBB voltage is indispensable for stably operating a semiconductor device. FIG. 23 is a block diagram showing a schematic structure of a conventional substrate bias voltage generating circuit. As shown in FIG. 23, a general conventional substrate bias voltage generating circuit comprises an active ring oscillator 111 and an active pump circuit 112 which are activated in an active mode during which data is read out from and written to a memory, a standby ring oscillator 121 and a standby pump circuit 122 which are activated in a standby mode during which data is not read out from or written to the memory.

Next, the operation of the conventional substrate bias voltage generating circuit will be explained. FIG. 24 is a flowchart showing the operation of the conventional substrate bias voltage generating circuit. First, in the substrate bias voltage generating circuit, a detection circuit (not shown) detects whether an operation state of a memory such as DRAM is the active mode or standby mode (step S1001).

When the operation state is the active mode, the detection circuit outputs an act signal to the active ring oscillator 111 and the active pump circuit 112, and they are brought into active state (steps S1002, S1003). With this operation, a large negative VBB potential is generated, which is suitable for high speed operation (step S1006), and the VBB potential is supplied to a substrate of a memory.

On the other hand, when the operation state is the standby mode, the detection circuit outputs a standby signal to the standby ring oscillator 121 and the standby pump circuit 122 and they are brought into the standby state (steps S1004, S1005). With this operation, a small negative VBB potential is generated, which reduces power consumption (step S1006), and the VBB potential is supplied to the substrate of the memory.

Initially, the conventional substrate bias voltage generating circuit comprised only one ring oscillator and one pump circuit. However, in order to reduce the electric current consumption and to supply VBB voltage having larger absolute value to the pump circuit, in the above-described structure each of the ring oscillators and pump circuits is divided into active-type and standby-type.

If the capacity of the memory is increased, however, the supply ability of VBB voltage must also be increased and thus, the area of the substrate bias voltage generating circuit must be increased. Therefore, it is desired to reduce the area of the substrate bias voltage generating circuit.

A yield of a memory has been enhanced recently and thus, it is necessary to also enhance a yield of the substrate bias voltage generating circuit by saving circuits which were assumed as being defective circuit heretofore.

With tendencies of thinning and lightening the semiconductor electronic device, it is required to reduce the power consumption. Therefore, it is necessary to reduce the electric current consumption of the substrate bias voltage generating circuit also.

In recent years, electrical equipment is controlled by exchanging data between three elements, i.e., a memory, a microcomputer, and a logic circuit. As processing technology has progressed, it has become possible to incorporate an LSI into electrical equipment, and a so-called memory incorporated ASIC (Application Specific Integrated Circuit) in which the above three elements are formed into one chip has received attention.

This memory-incorporated ASIC is different from a general combination of the memory and the microcomputer in that not only the size can be made compact, but also a bus width is widened so that the data transmission speed can be increased and power consumption can be reduced. That is, in this memory-incorporated ASIC, since it is necessary to design memories of various capacities depending upon requirements, there is a problem that it is not always the best to utilize a substrate bias voltage generating circuit for a conventional standardized memory capacity.

SUMMARY OF THE INVENTION

It is an object of this invention to provide a substrate bias voltage generating circuit in which a tuning mechanism of a VBB voltage is provided in a ring oscillator and a pump circuit so that an area occupied by the circuit is reduced, power consumption is reduced, it is easy to design the circuit and the yield is enhanced.

According to the substrate bias voltage generating circuit of one aspect of the present invention, different oscillation outputs output by respective detector circuits for each detection signal are obtained from ring oscillators corresponding to every detector circuit. Further, a selector is made to selectively output one of the oscillation outputs. Therefore, one pump circuit can be commonly used.

According to the substrate bias voltage generating circuit of another aspect of the present invention, different oscillation outputs corresponding to the plurality of detector circuits are generated by one ring oscillator and at least one frequency divider. Accordingly, a plurality of ring oscillators become unnecessary.

According to the substrate bias voltage generating circuit of still another aspect of the present invention, in the one pump circuit, the power source voltage to be supplied to all or a portion of the semiconductor device constituting the substrate bias voltage generating circuit is switched in accordance with the plurality of different detection signals. Therefore, the supplying ability of the substrate bias voltage can be changed.

Other objects and features of this invention will become apparent from the following description with reference to the accompanying drawings.

BRIEF DESCRIPTION OF THE DRAWINGS

FIG. 11 is a flowchart showing the operation of the substrate bias voltage generating circuit of the fifth embodiment;

FIG. 24 is a flowchart showing the operation of the conventional substrate bias voltage generating circuit.

DESCRIPTION OF THE PREFERRED EMBODIMENTS

Embodiments of substrate bias voltage generating circuits of the present invention will be explained based on the drawings. The present invention is not limited to the embodiments.

Figure 1:
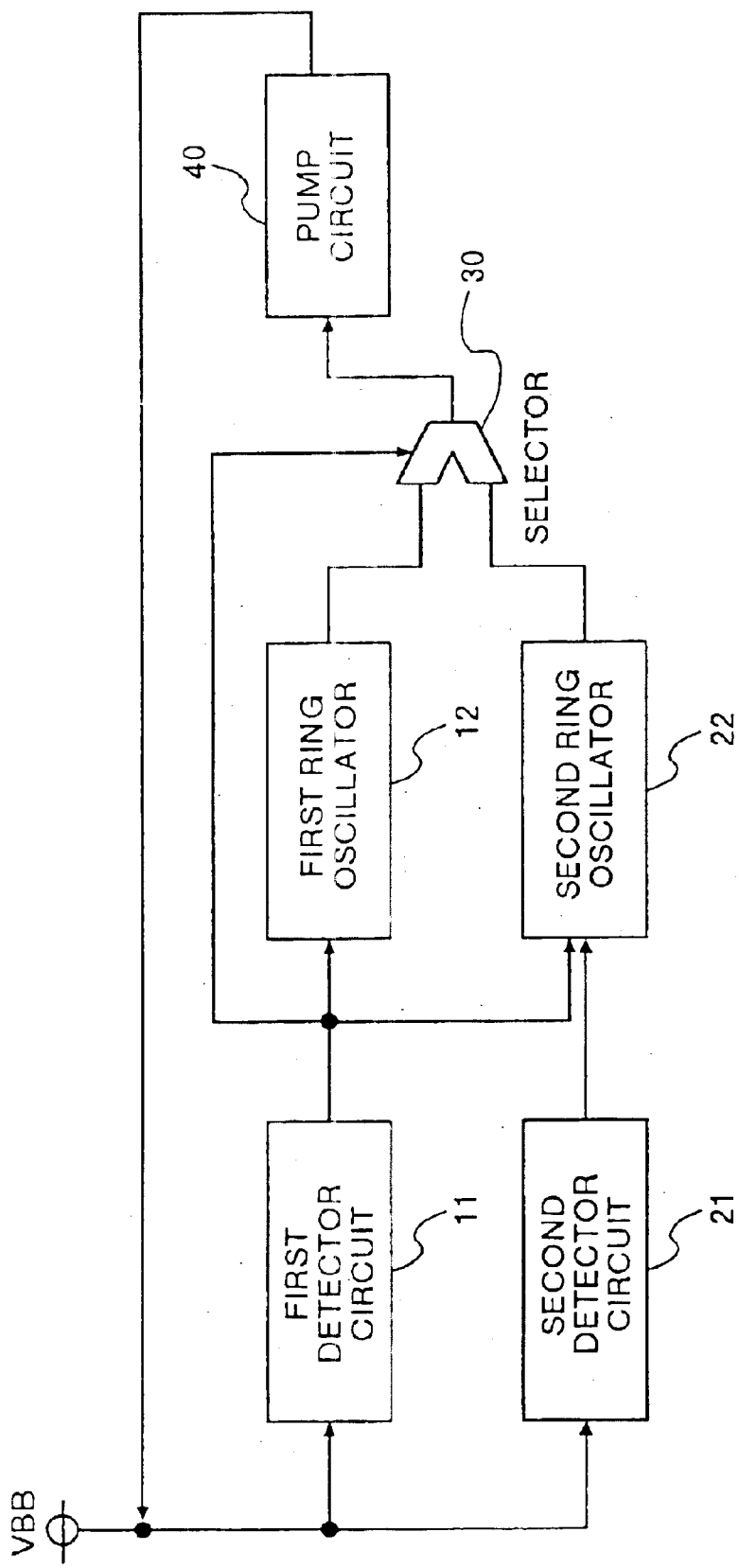
FIG. 1 is a schematic block diagram a structure of a substrate bias voltage generating circuit according to a first embodiment.

A substrate bias voltage generating circuit according to a first embodiment will be explained first. FIG. 1 is a schematic block diagram a structure of a substrate bias voltage generating circuit according to the first embodiment. The substrate bias voltage generating circuit shown in FIG. 1 comprises a first detector circuit 11 for self-detecting that a VBB voltage is greater than a first reference value, a first ring oscillator 12 which is brought into an active state in accordance with a first detector signal output from the first detector circuit 11, a second detector circuit 21 for self-detecting that the VBB voltage is greater than a second reference value, and a second ring oscillator 22 which is brought into an active state when the VBB voltage is equal to or smaller than the first reference value and equal to or greater than the second reference value in accordance with the first detector signal and a second detector signal output from the second detector circuit 21.

The substrate bias voltage generating circuit shown in FIG. 1 includes a selector 30. An oscillation voltage (first pumping voltage, hereinafter) output from the first ring oscillator 12 and an oscillation voltage (second pumping voltage, hereinafter) output from the second ring oscillator 22 are input to the selector 30. The selector 30 selectively outputs the first pumping voltage when the first detector signal is input, and selectively outputs the second pumping voltage when the first detector signal is not input. The substrate bias voltage generating circuit also includes a pump circuit 40 which generates a VBB voltage based on the pumping voltage output from the selector 30.

That is, the substrate bias voltage generating circuit of the first embodiment commonly uses one pump circuit 40, and determines the pumping voltage to be input to the pump circuit 40 in accordance with a value of the VBB voltage.

Figure 2:
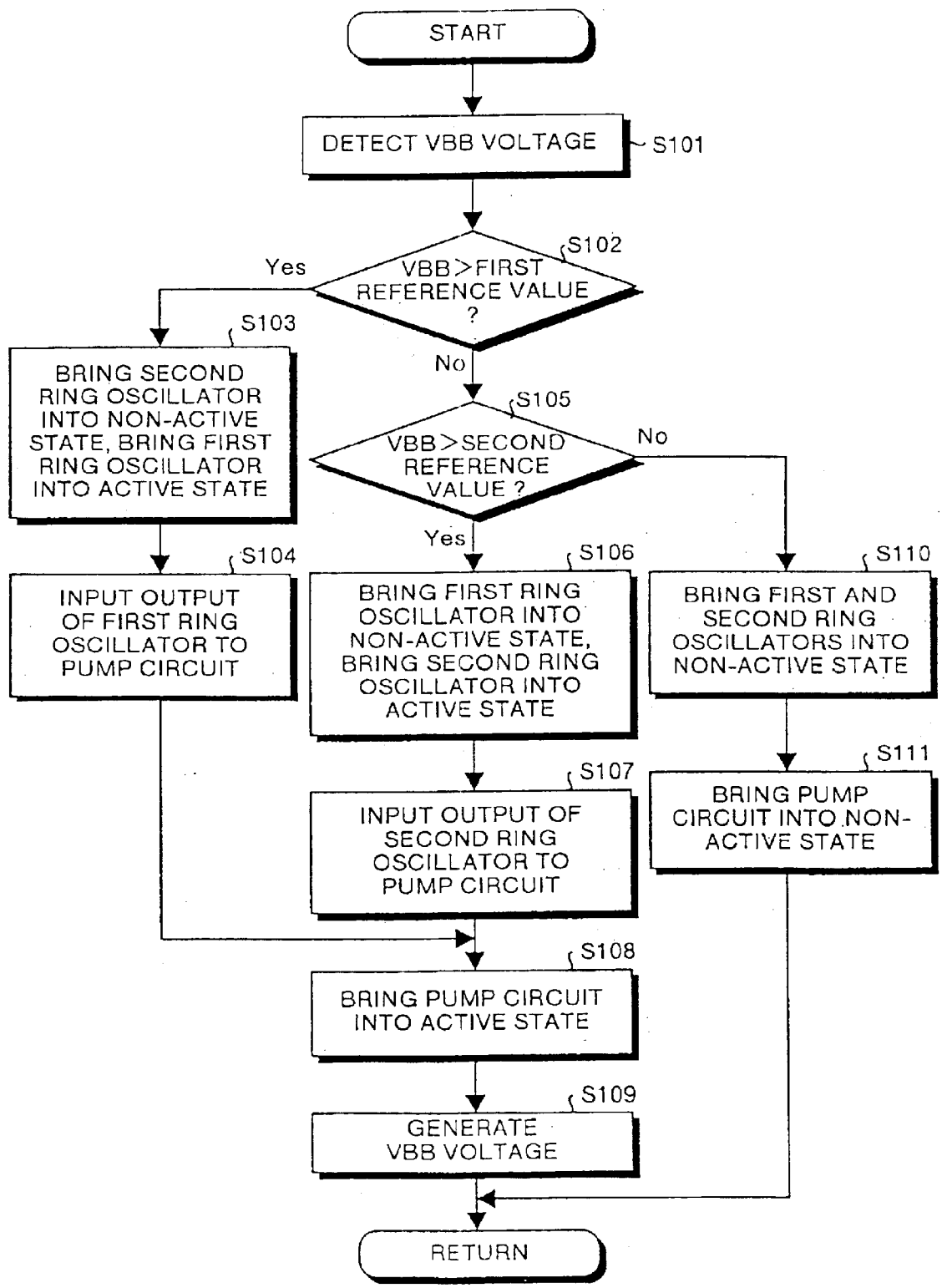
FIG. 2 is a flowchart showing the operation of the substrate bias voltage generating circuit of the first embodiment.

Next, the operation of the substrate bias voltage generating circuit of the first embodiment will be explained. FIG. 2 is a flowchart showing the operation of the substrate bias voltage generating circuit of the first embodiment. First, in the substrate bias voltage generating circuit, VBB voltage is input to the first detector circuit 11 and the second detector circuit 21 to detect the VBB voltage (step S101).

In the first detector circuit 11, if it is detected that the input VBB voltage is greater than the first reference value (e.g., −0.8V) (YES in step S102), the first detector circuit 11 outputs the first detector signal. This first detector signal is input to the first ring oscillator 12 to bring the latter into the active state (step S103). At that time, the second ring oscillator 22 is brought into a non-active state, which is a suspended state.

With this operation, the output of the first ring oscillator 12, i.e., the first pumping voltage is input to the selector 30. If the first detector signal is input to the selector 30, the first pumping voltage is selectively input to the pump circuit 40 (step S104). The pump circuit 40 is brought into the active state in accordance with the input of the first pumping voltage (step S108) and the VBB voltage is generated (step S109). Especially the flow of procedures in steps S102 to 104, 108 and 109 mean that a VBB voltage of −1.0V, e.g., can be swiftly generated and supplied when high supply ability of voltage substrate bias voltage is required, e.g., at power-on or at the time of operation of the memory.

On the other hand, in the second detector circuit 21, if it is detected that the input VBB voltage is greater than the second reference value (e.g., −1.0V), the second detector circuit 21 outputs the second detector signal. In this case, since the first detector signal does not indicate a detection state, it can be found that the input VBB voltage is smaller than the first reference value and greater than the second reference value from the first detector signal which does not indicate the detection state and the second detector signal which indicates the detection state (NO in step S102, and YES in step S105).

A second detector signal which indicates the detection state and the first detector signal which does not indicate the detection state are input to the second ring oscillator 22 to bring the latter into the active state (step S106). At that time, the first ring oscillator 12 is brought into a non-active state, which is a suspended state.

With this operation, the output of the second ring oscillator 22, i.e., the second pumping voltage is input to the selector 30. Since the first detector signal is not input to the selector 30, the second pumping voltage is selectively input to the pump circuit 40 (step S107). The pump circuit 40 is brought into the active state in accordance with the input of the second pumping voltage (step S108) and the VBB voltage is generated (step S109). Especially the flow of procedures in steps S102, 105 to 109 mean that an appropriate VBB voltage can be swiftly generated and supplied when the VBB voltage approaches, e.g., −1.0V, and high supply ability is not required, and VBB voltage consumption is supplemented when the memory is not operated.

When the input VBB voltage is smaller than both the first and second reference values (NO in step S105), both the first ring oscillator 12 and the second ring oscillator 22 are brought into non-active states which are suspended states (step S110). With this, the pump circuit 40 is also brought into a non-active state which is a suspended state (step S111).

As explained above, according to the substrate bias voltage generating circuit of the first embodiment, a voltage level of the VBB is detected and the ring oscillators and the pump circuits are activated and suspended, the VBB voltage is not supplied to the memory substrate excessively. Further, one pump circuit is commonly used, so an area of the circuit can be reduced as compared with the conventional structure having a plurality of pump circuits. Although it is necessary that the substrate bias voltage generating circuit of the first embodiment be newly provided with a selector, since the selector has a smaller circuit scale than the pump circuit, this addition does not cause a problem.

Figure 23:
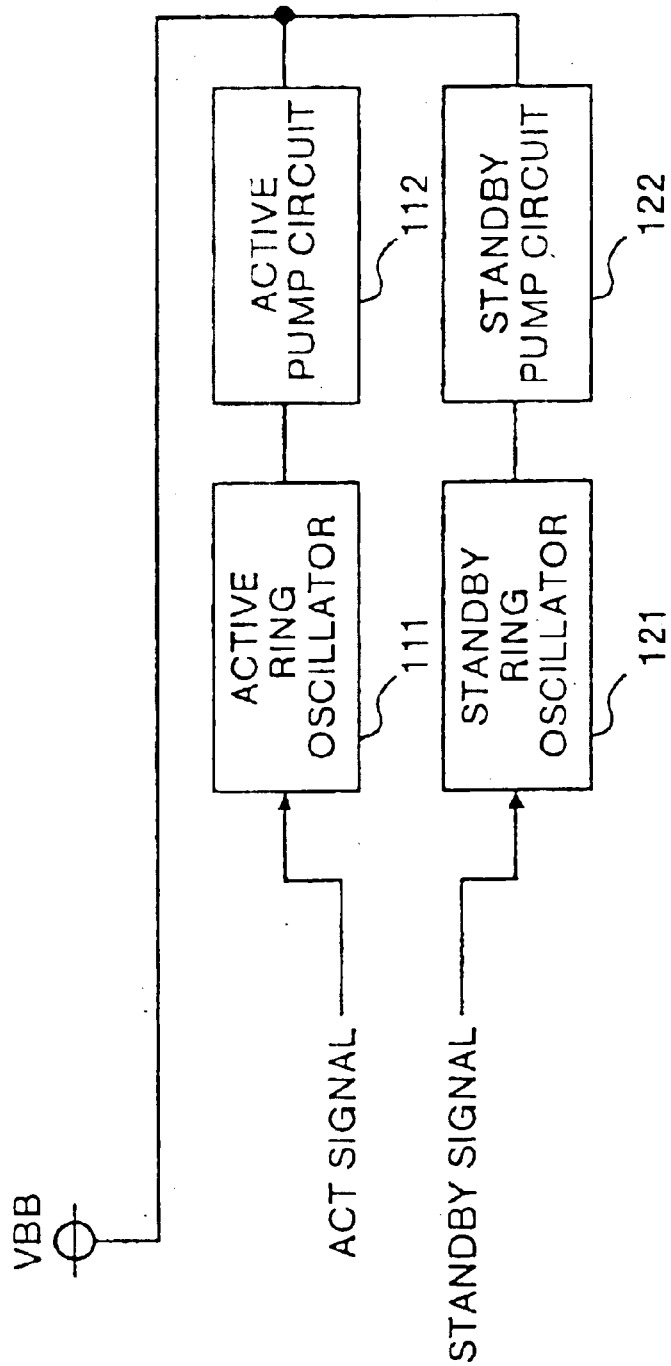
FIG. 23 is a schematic block diagram of a structure of a conventional substrate bias voltage generating circuit.

The pump circuit 40 has a larger circuit scale than the conventional standby pump circuit 122 shown in FIG. 23, the operation speed of pump circuit 40 can be increased correspondingly and thus, electric current consumed is almost the same as that of the conventional standby pump circuit 122.

Further, in the substrate bias voltage generating circuit of the first embodiment, the VBB voltage is generated recursively based on the result of the self detection of the VBB voltage. If the substrate bias voltage generating circuit has three or more detector circuits, i.e., three or more reference values (detection levels), it is possible to generate the feedback of the VBB voltage in more detail.

Figure 3:
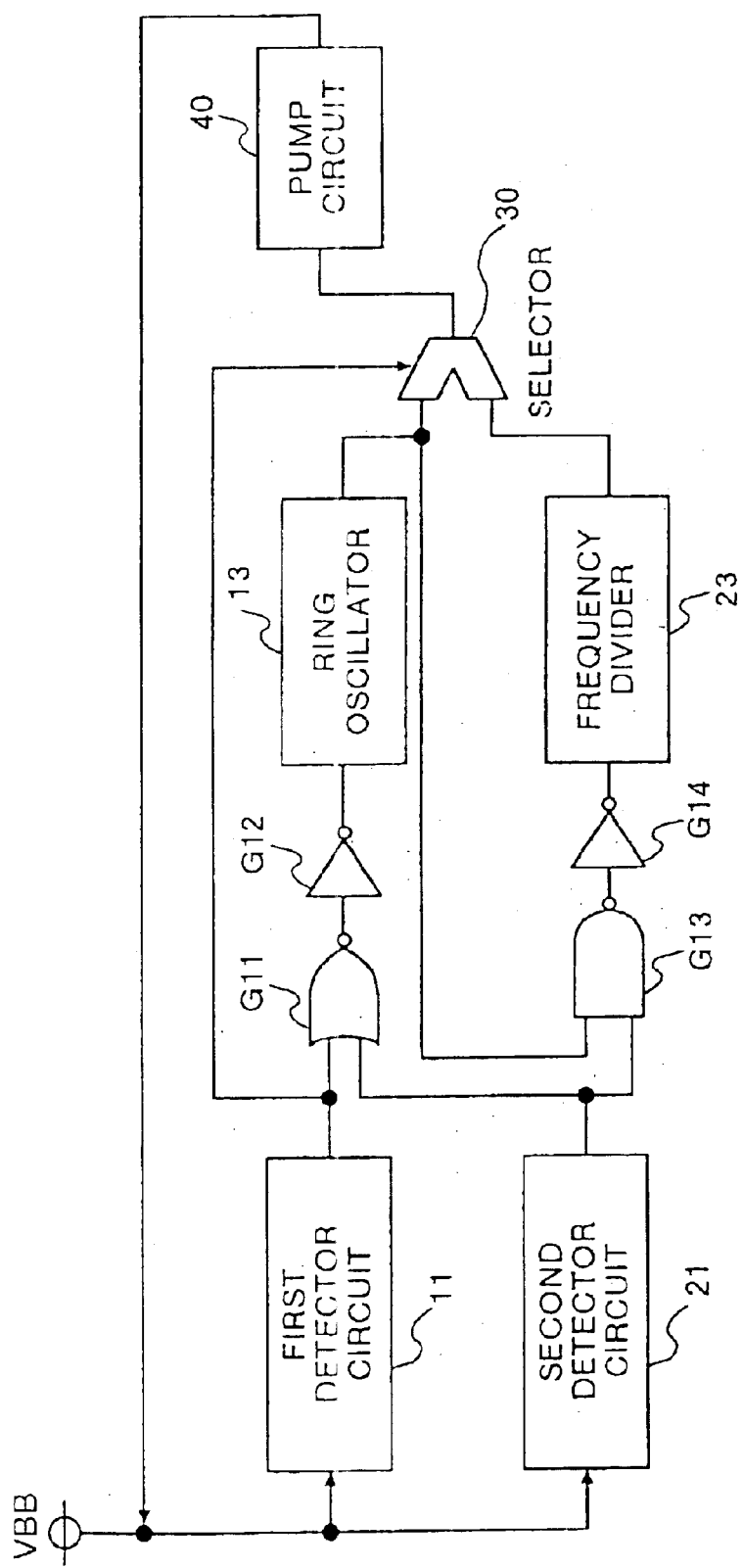
FIG. 3 is a schematic block diagram a structure of a substrate bias voltage generating circuit according to a second embodiment.

Next, a substrate bias voltage generating circuit of the second embodiment will be explained. FIG. 3 is a schematic block diagram a structure of a substrate bias voltage generating circuit according to the second embodiment. Elements similar to those shown in FIG. 1 are designated with the same reference symbols, and explanation thereof is omitted.

The substrate bias voltage generating circuit shown in FIG. 3 is different from that shown in FIG. 1 in that the former substrate bias voltage generating circuit has one ring oscillator, and a frequency divider 23 is newly provided. That is, the ring oscillator 13 is commonly used, the first pumping voltage output from the ring oscillator 13 is input to the selector 30, the first pumping voltage is input to the frequency divider 23, thereby delaying the frequency of a voltage, and the voltage is input as the second pumping voltage. Further, in order to control bringing the ring oscillator 13 into an active state or to judge whether a voltage is sent through the frequency divider 23, an NOR gate G11, inverters G12 and G14, and an NAND gate G13 are provided.

Figure 4:
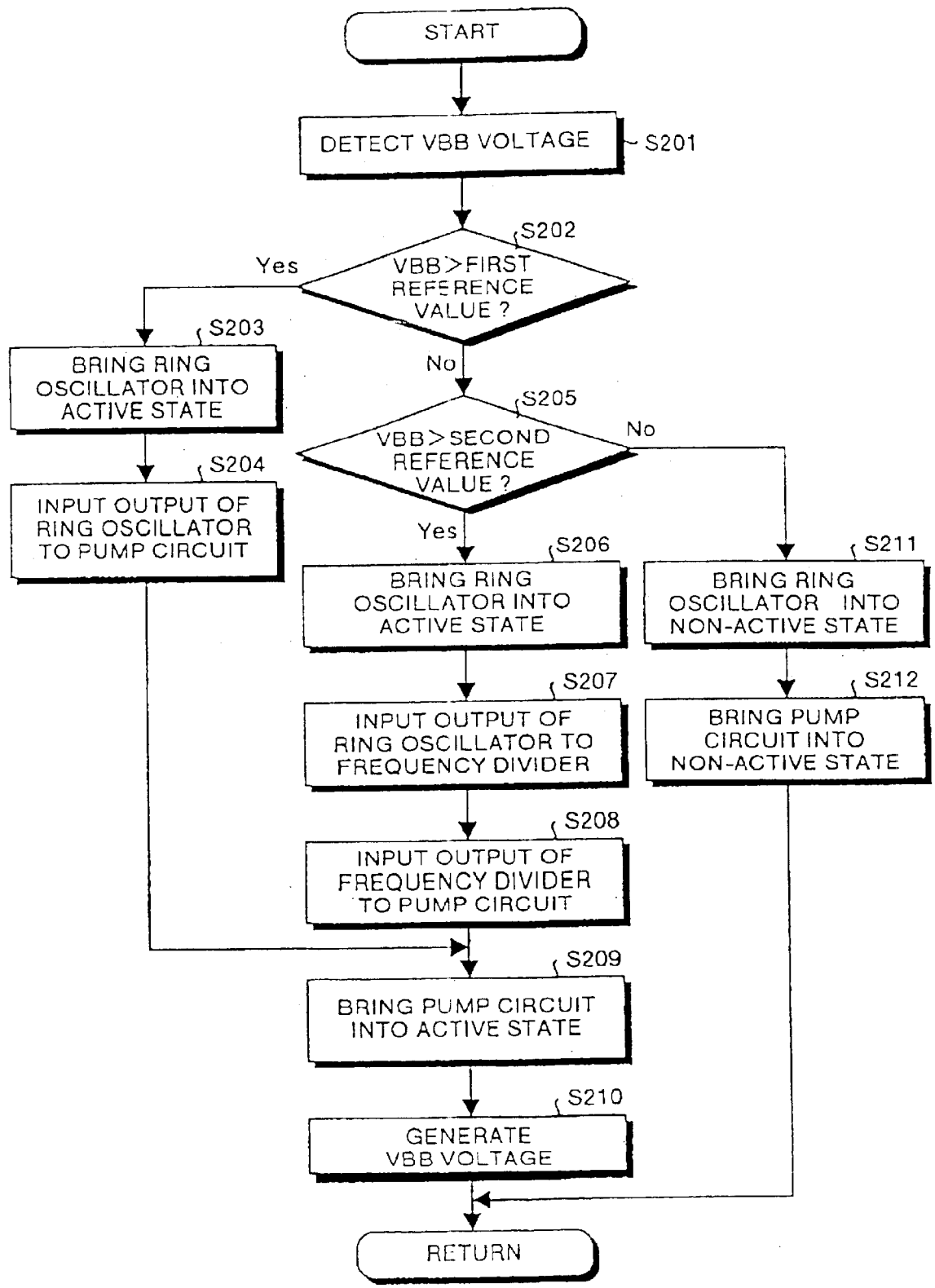
FIG. 4 is a flowchart showing the operation of the substrate bias voltage generating circuit of the second embodiment.

Next, the operation of the substrate bias voltage generating circuit of the second embodiment will be explained. FIG. 4 is a flowchart showing the operation of the substrate bias voltage generating circuit of the second embodiment. First, in the substrate bias voltage generating circuit, VBB voltage is input to the first detector circuit 11 and the second detector circuit 21 to detect the VBB voltage (step S201).

In the first detector circuit 11, if it is detected that the input VBB voltage is greater than the first reference value (e.g., −0.8V) (YES in step S202), the first detector circuit 11 outputs a first detector signal of logic level "H". The first detector signal is input to one of input terminals of the NOR gate G11. Here, the NOR gate G11 outputs a signal of logic level "L" irrespective of a signal state of the other input terminal. This logic level "L" is inverted in the inverter G12 and input to the ring oscillator 13. With this operation, the ring oscillator 13 is brought into the active state (step S203).

With this operation, the output of the ring oscillator 13, i.e., the first pumping voltage, is input to the selector 30. If the first detector signal is input to the selector 30, the first pumping voltage is selectively input to the pump circuit 40 (step S204). The pump circuit 40 is brought into the active state in accordance with the input of the first pumping voltage (step S209) and the VBB voltage is generated (step S210). Especially the flow of procedures in steps S202 to 204, 209 and 210 means that a VBB voltage of −1.0V, e.g., can be swiftly generated and supplied when high supply ability of voltage substrate bias voltage is required, e.g., at power-on or at the time of operation of the memory.

On the other hand, if it is detected that the input VBB voltage is greater than the second reference value (e.g., −1.0V), the second detector circuit 21 outputs a second detector signal of logic level "H" (NO in step S202 and YES in step S205). This second detector signal is input to the second input terminals of the NOR gate G11 and one of the input terminal of the NAND gate G13. Here, the NOR gate G11 outputs a signal of logic level "L" irrespective of a signal state of the first input terminal. This logic level "L" is inverted in the inverter G12 and input to the ring oscillator 13. With this operation, the ring oscillator 13 is brought into the active state (step S206).

The output of the ring oscillator 13, i.e., the first pumping voltage, input to the other input terminal, is input to the NAND gate G13, but since a signal of logic level "H" is input to one of the input terminals, the first pumping voltage is inverted and sequentially output. Since this output is inverted in the inverter G14, a voltage of the same phase as that of the first pumping state is input to the frequency divider 23 (step S207).

In the frequency divider 23, the first pumping voltage is divided into the same frequency as that of the second pumping voltage output in the second ring oscillator 22 explained in the first embodiment, and input to the selector 30.

Since the first detector signal is not input to the selector 30, the second pumping voltage is selectively input to the pump circuit 40 (step S208). The pump circuit 40 is brought into the active state in accordance with the input of the second pumping voltage (step S209), and generates the VBB voltage (step S210). Especially the flow of procedures in steps S202, 205 to 210 means that an appropriate VBB voltage can be swiftly generated and supplied when the VBB voltage approaches, e.g., −1.0V, and high supply ability is not required, and VBB voltage consumption is supplemented when the memory is not operated.

When the input VBB voltage is smaller than the second reference value (NO in step S205), the ring oscillator 13 is brought into a non-active state which is a suspended state (step S211). The pump circuit 40 is also brought into a non-active state which is a suspended state (step S212).

As explained above, according to the substrate bias voltage generating circuit of the second embodiment, this circuit has the same function as the first and second ring oscillators shown in the first embodiment, the same effect as the first embodiment can be exhibited, and the ring oscillator is replaced by the frequency divider having smaller size, and the circuit area can be reduced correspondingly. Further, since the number of circuits is reduced, it is possible to shorten design time.

Figure 5:
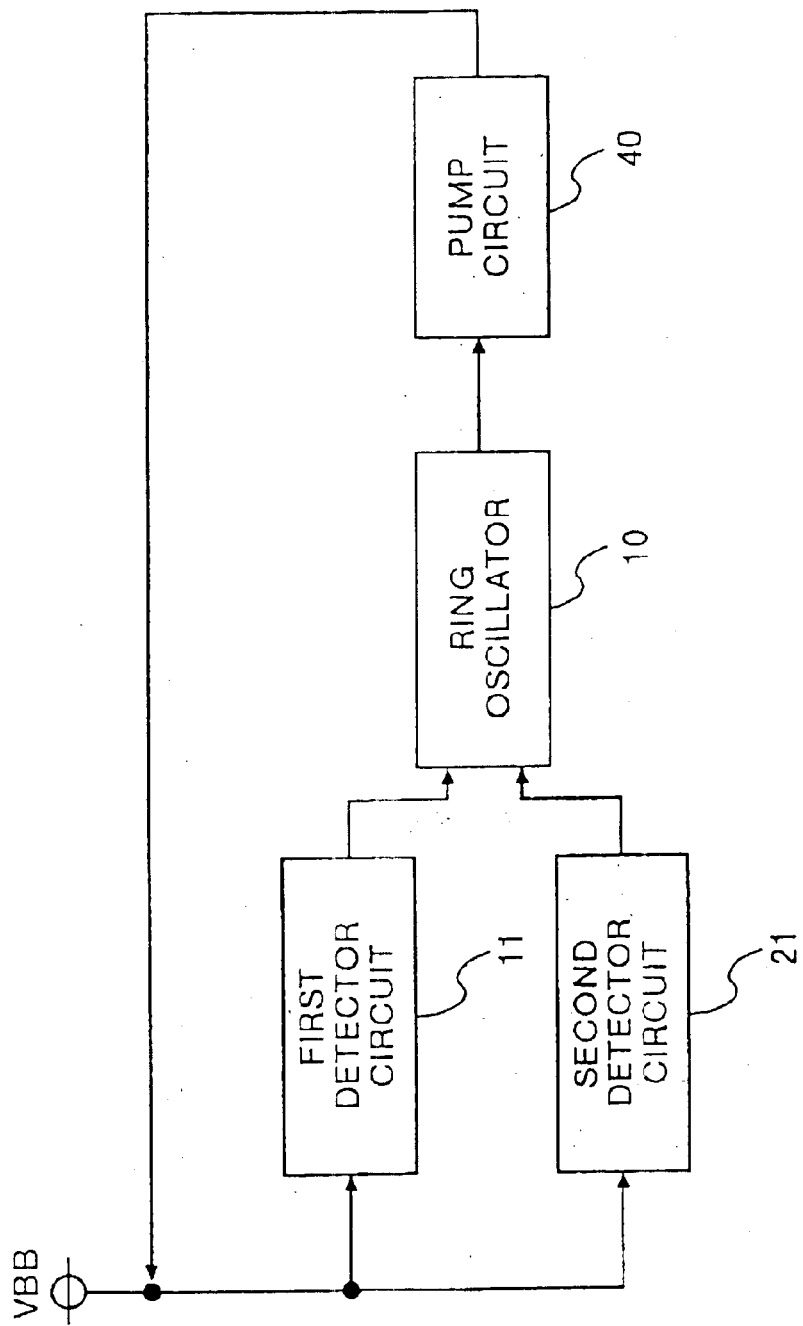
FIG. 5 is a schematic block diagram a structure of a substrate bias voltage generating circuit according to a third embodiment.

Next, a substrate bias voltage generating circuit of the third embodiment will be explained. FIG. 5 is a schematic block diagram a structure of a substrate bias voltage generating circuit according to the third embodiment. Elements similar to those shown in FIG. 1 are designated with the same reference symbols, and explanation thereof is omitted.

The substrate bias voltage generating circuit shown in FIG. 5 is different from that shown in FIG. 1 in that the former substrate bias voltage generating circuit has one ring oscillator, and a pumping voltage is tuned in accordance with the first and second detector signals in the ring oscillator 10. Thus, the third embodiment has a feature also in the inside structure of the ring oscillator 10.

Figure 6:
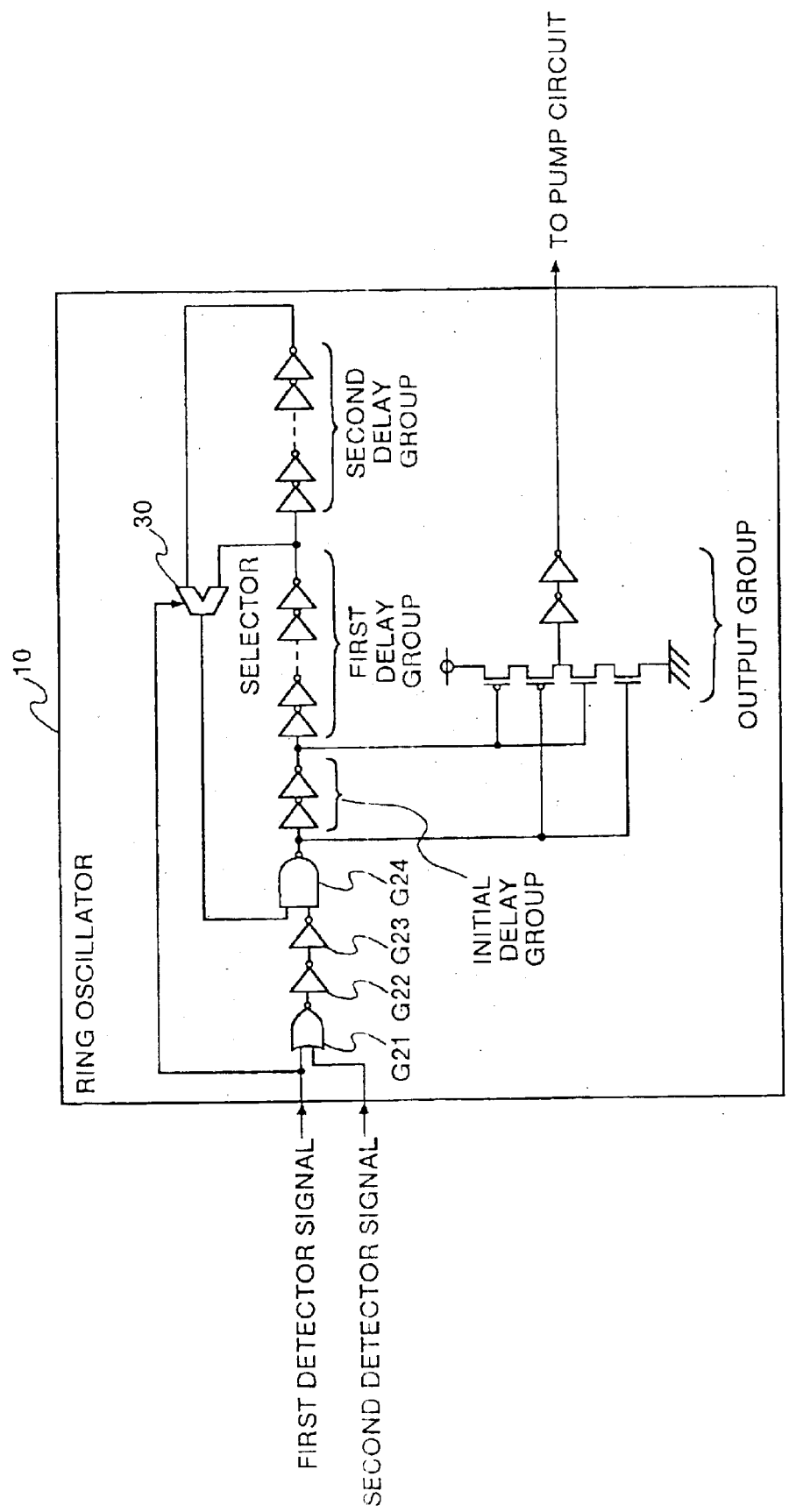
FIG. 6 is a circuit diagram of a ring oscillator of the substrate bias voltage generating circuit of the third embodiment.

FIG. 6 is a circuit diagram of a ring oscillator 10 of the substrate bias voltage generating circuit of the third embodiment. In FIG. 6, the ring oscillator 10 comprises an NOR gate G21 to which the first and second detector signals are input, inverters G22 and G23 for sequentially inverting an output of the NOR gate G21, and an NAND gate G24. An output from the inverter G23 is input to one of input terminals of the NAND gate G24.

The ring oscillator 10 further comprises an initial delay group comprising a plurality of serially connected inverters, a first delay group serially connected to the initial delay group and comprising m-number of serially connected inverters, a second delay group serially connected to the initial delay group and comprising n-number of serially connected inverters, and an output group for generating a VBB voltage based on an output from the NAND gate G24 and an output from the initial delay group.

Further, the substrate bias voltage generating circuit includes the selector 30 which selectively outputs an output of the first delay group when the output of the first delay group and an output of the second delay group are input and the first detector signal is input, and selectively outputs the output of the second delay group when the first detector signal is not input.

That is, when the first detector signal is output in the first detector circuit 11, a pumping voltage having a frequency determined by the delay of the m-number of inverters is generated, and when the second detector signal is output in the second detector circuit 21, a pumping voltage having frequency determined by the delay of the m+n number of inverters is generated. This means that the same effect as the second embodiment can be obtained.

Figure 7:
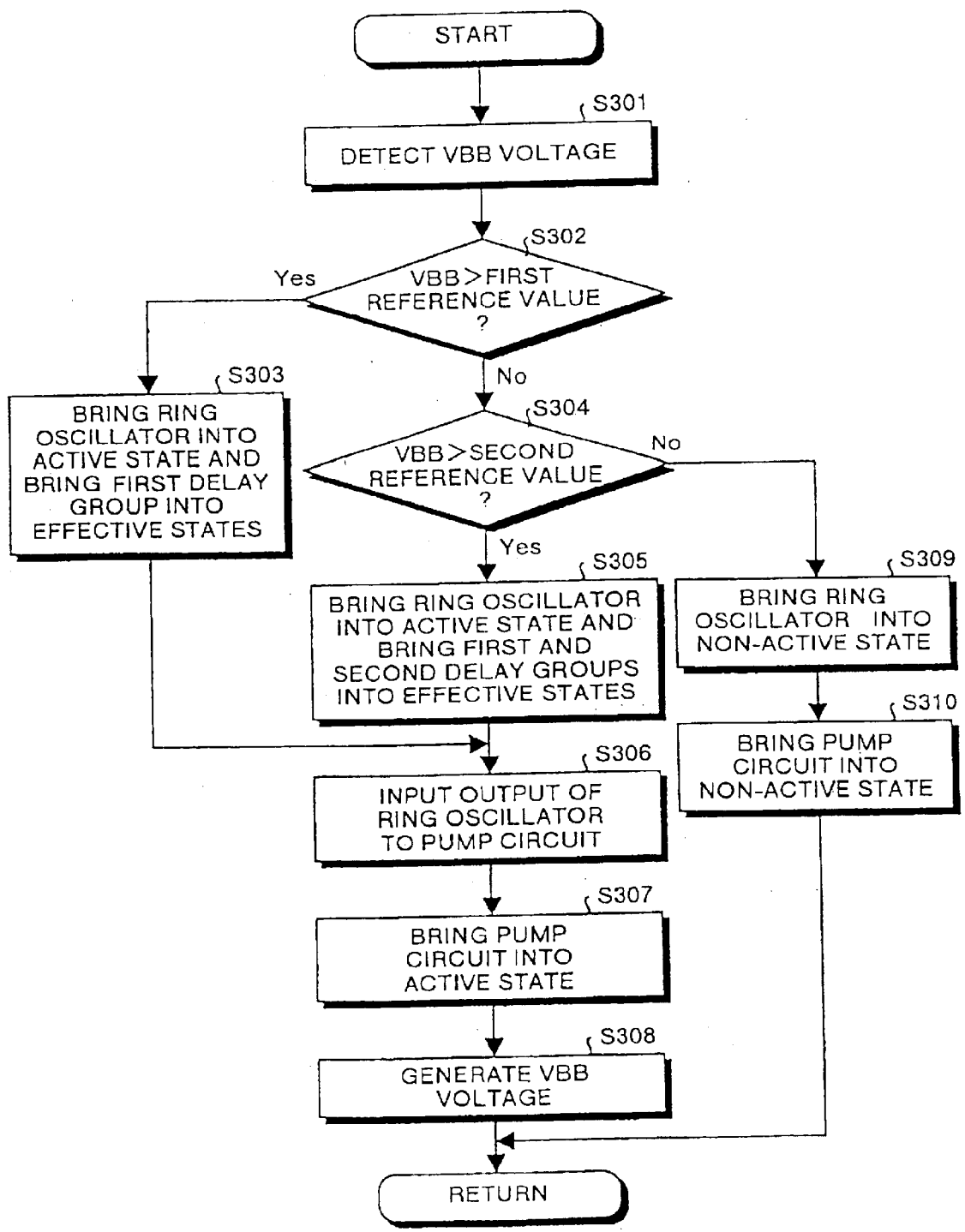
FIG. 7 is a flowchart showing the operation of the substrate bias voltage generating circuit of the third embodiment.

Next, the operation of the substrate bias voltage generating circuit of the third embodiment will be explained. FIG. 7 is a flowchart showing the operation of the substrate bias voltage generating circuit of the third embodiment. First, in the substrate bias voltage generating circuit, VBB voltage is input to the first detector circuit 11 and the second detector circuit 21 to detect the VBB voltage (step S301)

In the first detector circuit 11, if it is detected that the input VBB voltage is greater than the first reference value (e.g., −0.8V) (YES in step S302), the first detector circuit 11 outputs the first detector signal of logical level "H". This first detector signal is input to the ring oscillator 10. With this operation, the ring oscillator 10 is brought into the active state, and an output of the first delay group is fed back by the selector 30 (step S303).

Therefore, a pumping voltage whose frequency is determined by the serial connection of the delay of the m-number of inverters is generated, and is input to the pump circuit 40 (step S306). The pump circuit 40 is brought into the active state in accordance with the input of the second pumping voltage (step S307), and generates the VBB voltage (step S308). Especially the flow of procedures in steps S302, 303, 306 to 308 means that a VBB voltage of −1.0V, e.g., can be swiftly generated and supplied when high supply ability of voltage substrate bias voltage is required, e.g., at power-on or at the time of operation of the memory.

On the other hand, if it is detected that the input VBB voltage is greater than the second reference value (e.g., −1.0V), the second detector circuit 21 outputs a second detector signal of logic level "H" (NO in step S302 and YES in step S304). This second detector signal is input to the ring oscillator 10. With this operation, the ring oscillator 10 is brought into the active state and the output of the delay group is fed back by the selector 30 (step S305).

Therefore, a pumping voltage whose frequency is determined by the serial connection of the delay of the m+n number of inverters is generated, and is input to the pump circuit 40 (step S306). The pump circuit 40 is brought into the active state in accordance with the input of the second pumping voltage (step S307), and generates the VBB voltage (step S308). Especially the flow of procedures in steps S302, 304 to 308 means that an appropriate VBB voltage can be swiftly generated and supplied when the VBB voltage approaches, e.g., −1.0V and high supply ability is not required, and VBB voltage consumption is supplemented when the memory is not operated.

When the input VBB voltage is smaller than the second reference value (NO in step S304), the ring oscillator 10 is brought into non-active states which are suspended states (step S309). With this, the pump circuit 40 is also brought into a non-active state which is a suspended state (step S310).

As explained above, according to the substrate bias voltage generating circuit of the third embodiment, since the ring oscillator 10 is provided therein with the tuning mechanism of oscillation frequency (delay amount), especially a mechanism for changing the number of inverters constituting the delay group, the same operation as the second embodiment can be carried out, and the same effect as the second embodiment can be obtained.

Next, a substrate bias voltage generating circuit of the fourth embodiment will be explained. The substrate bias voltage generating circuit of the fourth embodiment includes another ring oscillator different from that shown in FIG. 5. Therefore, a circuit structure of the ring oscillator will be explained below.

Figure 8:
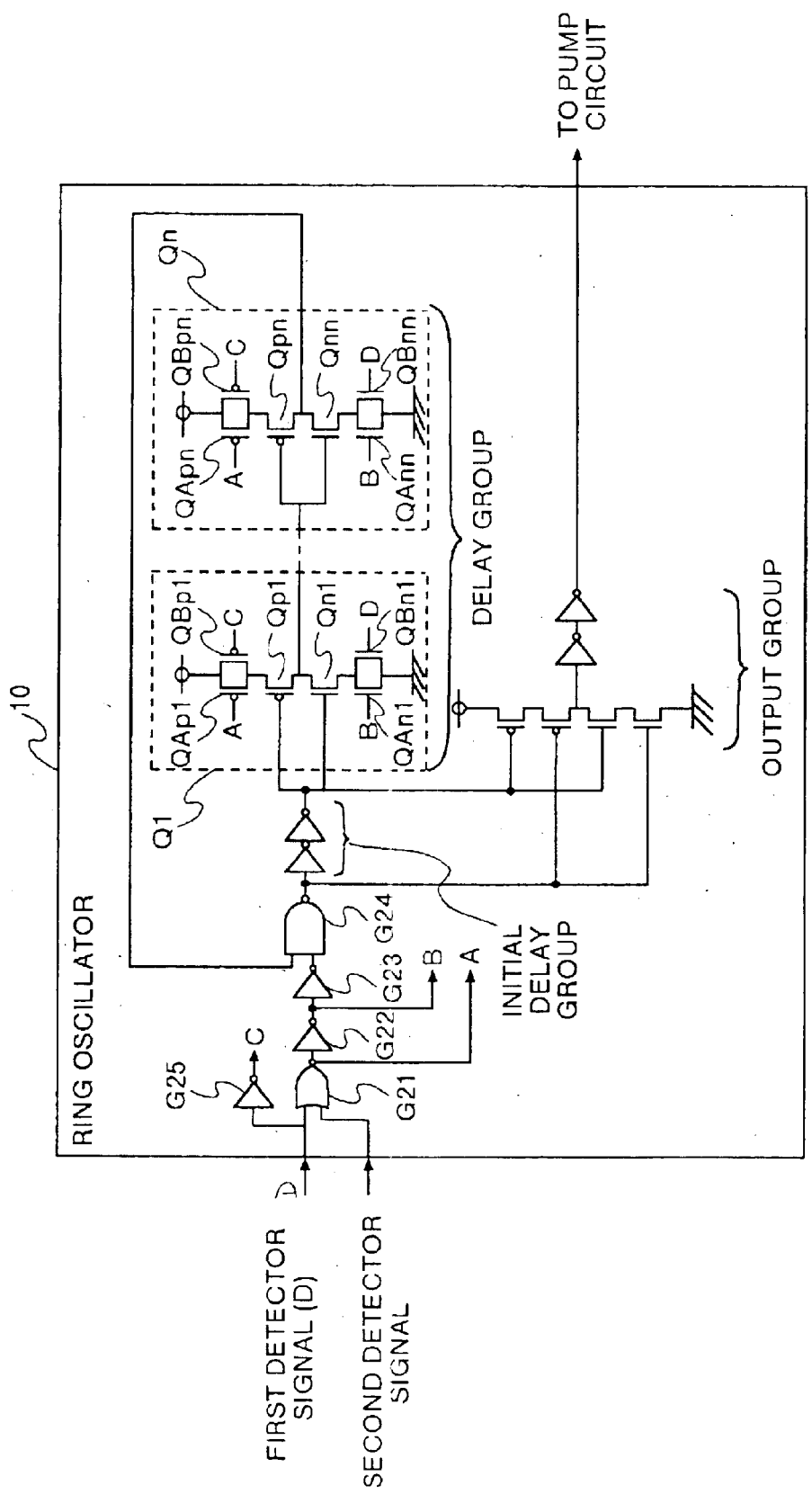
FIG. 8 is a circuit diagram of a ring oscillator of a substrate bias voltage generating circuit of a fourth embodiment.

FIG. 8 is a circuit diagram of the ring oscillator 10 of the substrate bias voltage generating circuit of the fourth embodiment. Elements similar to those shown in FIG. 6 are designated with the same reference symbols, and explanation thereof is omitted. In FIG. 8, the fourth embodiment is different from that shown in FIG. 6 in that the ring oscillator 10 includes an inverter G25, an output of the NOR gate G21 is a signal A, an output of the inverter G22 is a signal B, a first detector signal which is a signal D is inverted by the inverter G25, and a result thereof is a signal C.

The fourth embodiment is different also in that the selector 30 shown in FIG. 6 is omitted, the first and second delay groups are replaced by a plurality of delay blocks Q1 to Qn. In the delay block Q1, a PMOS transistor Qp1 and an NMOS transistor Qn1 are complementary and connected to constitute an inverter. PMOS transistors QAp1 and QBp1 whose drains are connected to each other and whose sources are connected to each other are provided on the side of a source of the PMOS transistor Qp1. NMOS transistors QAn1 and QBn1 whose drains are connected to each other and whose sources are connected to each other are provided on the side of a source of the NMOS transistor Qn1.

The PMOS transistor QAp1 receives the signal A at its gate, and the PMOS transistor QBp1 receives the signal C at its gate. Further, NMOS transistor QAn1 receives the signal B at its gate, and the NMOS transistor QBn1 receives the signal D at its gate. Other delay blocks Qn and the like have the same structures.

The ring oscillator 10 shown in FIG. 8 is a current limited-type ring oscillator in which a passing current amount is controlled in accordance with a logic state of each of the signals A to D. To control the passing current amount is to control oscillation frequency (delay amount). Here, when the first detector signal is output, in each of the delay blocks, all the PMOS transistor QAp1 and NMOS transistor QAn1 (simply MOS transistor QA, hereinafter), as well as the PMOS transistor QBp1 and NMOS transistor QBn1 (simply MOS transistor QB, hereinafter) are turned ON.

On the other hand, when the second detector signal is output, in each of the delay blocks, the PMOS transistor QAp1 and the NMOS transistor QAn1 (simply MOS transistor QA, hereinafter) are turned ON, and the PMOS transistor QBp1 and NMOS transistor QBn1 (simply MOS transistor QB, hereinafter) are turned OFF. That is, when the second detector signal is output, current is limited in each of the delay blocks as compared with a case in which the first detector signal is output, and the delay becomes greater. This means that the same operation as that of the second embodiment is realized.

Figure 9:
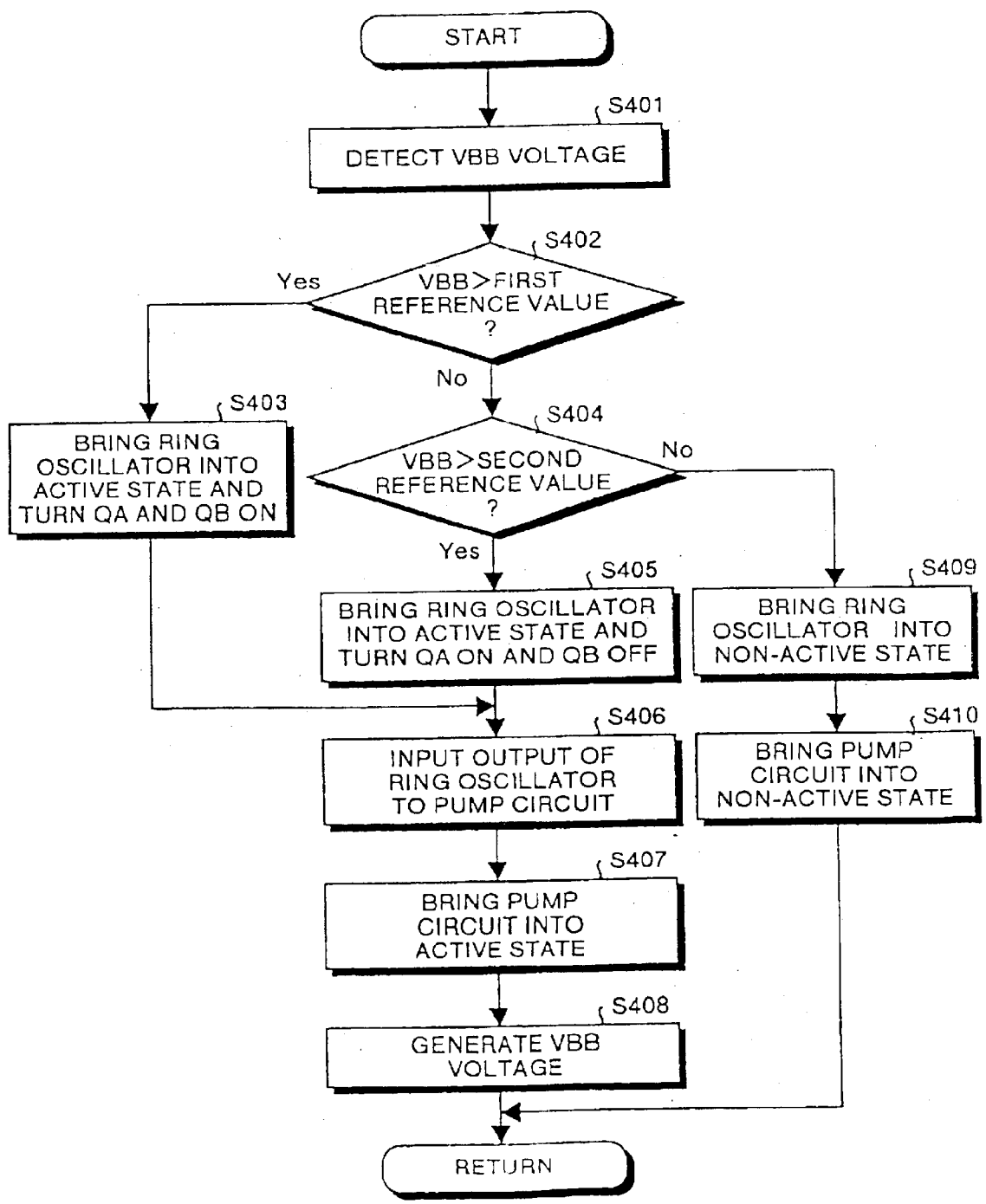
FIG. 9 is a flowchart showing the operation of the substrate bias voltage generating circuit of the fourth embodiment.

Next, the operation of the substrate bias voltage generating circuit of the fourth embodiment will be explained. FIG. 9 is a flowchart showing the operation of the substrate bias voltage generating circuit of the fourth embodiment. First, in the substrate bias voltage generating circuit, VBB voltage is input to the first detector circuit 11 and the second detector circuit 21 to detect the VBB voltage (step S401).

In the first detector circuit 11, if it is detected that the input VBB voltage is greater than the first reference value (e.g., −0.8V) (YES in step S402), the first detector circuit 11 outputs the first detector signal of logical level "H". This first detector signal is input to the ring oscillator 10. With this operation, the ring oscillator 10 is brought into the active state. Further, the first detector signal of logic level "H" brings the signals A, B, C and D into logic levels "L", "H", "L" and "H", respectively. This means that the MOS transistors Qa and QB in each of the delay blocks are turned ON (step S403).

The oscillation frequency (delay amount) is determined by the current limitation when all the MOS transistors QA and QB in each of the delay blocks are turned ON, and the pumping voltage is generated based on the determined oscillation frequency (delay amount). This pumping voltage is input to the pump circuit 40 (step S406). The pump circuit 40 is brought into the active state in accordance with the input of this pumping voltage (step S407), and generates the VBB voltage (step S408). Especially the flow of procedures in steps S402, 403, 406 to 408 means that a VBB voltage of −1.0V, e.g., can be swiftly generated and supplied when high supply ability of voltage substrate bias voltage is required, e.g., at power-on or at the time of operation of the memory.

On the other hand, if it is detected that the input VBB voltage is greater than the second reference value (e.g., −1.0V), the second detector circuit 21 outputs a second detector signal of logic level "H" (NO in step S402 and YES in step S404). This second detector signal is input to the ring oscillator 10. With this operation, the ring oscillator 10 is brought into the active state. Here, the first detector signal is at logic level "L". Further, the second detector signal of logic level "H" and the first detector signal of logic level "L" bring the signals A, B, C and D into logic levels "L", "H", "H" and "L", respectively. This means that the MOS transistor QA in each of the delay blocks is turned ON and the MOS transistor QB is turned OFF (step 5405).

The oscillation frequency (delay amount) when only the MOS transistor QA in each of the delay blocks is turned ON is determined, and the pumping voltage is generated based on the determined oscillation frequency (delay amount). This pumping voltage is input to the pump circuit 40 (step S406). The pump circuit 40 is brought into the active state in accordance with the input of this pumping voltage (step S407), and generates the VBB voltage (step S408). Especially the flow of procedures in steps S402, 404 to 408 means that an appropriate VBB voltage can be swiftly generated and supplied when the VBB voltage approaches, e.g., −1.0V and high supply ability is not required, and VBB voltage consumption is supplemented when the memory is not operated.

When the input VBB voltage is smaller than the second reference value (NO in step S404), the ring oscillator 10 is brought into a non-active state which is a suspended state (step S409). With this, the pump circuit 40 is also brought into a non-active state which is a suspended state (step S410).

As explained above, according to the substrate bias voltage generating circuit of the fourth embodiment, since the ring oscillator 10 is provided therein with the tuning mechanism of oscillation frequency (delay amount), especially a mechanism for ON/OFF controlling the MOS transistor which limits the current of the delay group, the same operation as the second embodiment can be carried out, and the same effect as the second embodiment can be obtained.

Next, a substrate bias voltage generating circuit of the fifth embodiment will be explained. The substrate bias voltage generating circuit of the fifth embodiment includes another current-limited type ring oscillator different from that shown in FIG. 8. Therefore, a circuit structure of the ring oscillator will be explained below.

Figure 10A:
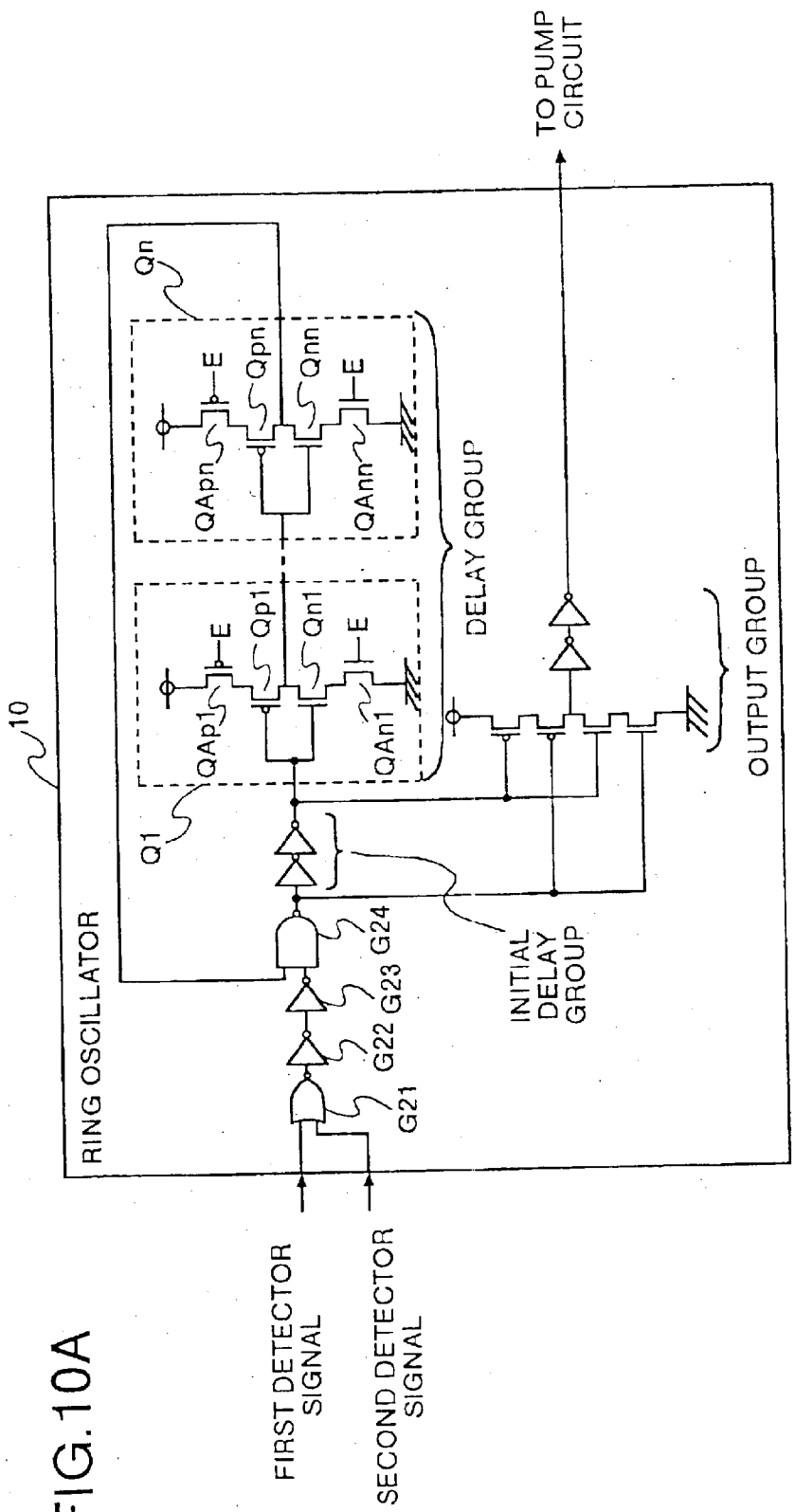
FIG. 10A and FIG. 10B are circuit diagrams of a ring oscillator of a substrate bias voltage generating circuit of a fifth embodiment.

FIG. 10A is a circuit diagram of the ring oscillator of the substrate bias voltage generating circuit of the fifth embodiment. Elements similar to those shown in FIG. 8 are designated with the same reference symbols, and explanation thereof is omitted. The fifth embodiment shown in FIG. 10A is different from that shown in FIG. 8 in that the inverter G25 is omitted, and inside structures of the delay blocks Q1 to Qn are changed.

In the delay block Q1 shown in FIG. 10A, the PMOS transistor Qp1 and the NMOS transistor Qn1 are complementary and connected to constitute an inverter. The PMOS transistor Qp1 is provided at its source side with the PMOS transistor QAp1, and the NMOS transistor Qn1 is provided at its source side with the NMOS transistor QAn1. The PMOS transistor QAp1 and the NMOS transistor QAn1 both receive signal E at their gates. Other delay blocks Qn and the like have the same structure.

Figure 10B:
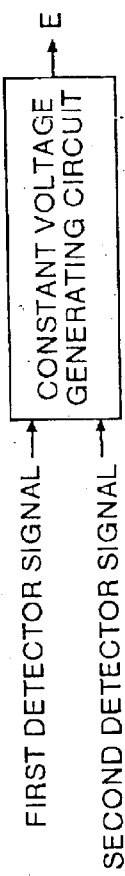

As shown in FIG. 10B, the signal E is generated by a constant voltage generating circuit to which the first detector signal and the second detector signal are input. Especially, the constant voltage generating circuit shown in FIG. 10B outputs the signal E as a higher voltage value when the first detector signal is at logic level "H" as compared with a case in which second detector signal is at logic level "H".

That is, when the second detector signal is output, the ring oscillator 10 shown in FIG. 10A largely limits the current in each of the delay blocks to increase the delay as compared with a case in which the first detector signal is output. With this feature, the same operation as the second embodiment can be carried out.

Next, the operation of the substrate bias voltage generating circuit of the fifth embodiment will be explained. FIG. 11 is a flowchart showing the operation of the substrate bias voltage generating circuit of the fifth embodiment. First, in the substrate bias voltage generating circuit, VBB voltage is input to the first detector circuit 11 and the second detector circuit 21 to detect the VBB voltage (step S501)

In the first detector circuit 11, if it is detected that the input VBB voltage is greater than the first reference value (e.g., −0.8V) (YES in step S502), the first detector circuit 11 outputs the first detector signal of logical level "H". This first detector signal is input to the ring oscillator 10. With this operation, the ring oscillator 10 is brought into the active state. Further, the first detector signal of logic level "H" generates the signal E of a voltage A in a voltage generating circuit. The voltage A is greater than a voltage B when the second detector signal is at logic level "H". The signal E of the voltage A is input to a gate of the MOS transistor QA (step S503).

Each of the delay blocks determines the oscillation frequency (delay amount) by the current limitation when the MOS transistor receives the voltage A at its gate, and the pumping voltage is generated based on the determined oscillation frequency (delay amount). This pumping voltage is input to the pump circuit 40 (step S506). The pump circuit 40 is brought into the active state in accordance with the input of this pumping voltage (step S507), and generates the VBB voltage (step S508). Especially the flow of procedures in steps S502, 503, 506 to 508 means that a VBB voltage of −1.0V, e.g., can be swiftly generated and supplied when high supply ability of voltage substrate bias voltage is required, e.g., at power-on or at the time of operation of the memory.

On the other hand, if it is detected that the input VBB voltage is greater than the second reference value (e.g., −1.0V), the second detector circuit 21 outputs a second detector signal of logic level "H" (NO in step S502 and YES in step S504). This second detector signal is input to the ring oscillator 10. With this operation, the ring oscillator 10 is brought into the active state. Further, the second detector signal of logic level "H" generates the signal E of a voltage B in the voltage generating circuit. The voltage B is less than the voltage A output when the first detector signal is at logic level "H". The signal E of the voltage B is input to a gate of the MOS transistor QA (step S505).

Each of the delay blocks determines the oscillation frequency (delay amount) by the current limitation when the MOS transistor QA receives the voltage B at its gate, and the pumping voltage is generated based on the determined oscillation frequency (delay amount). This pumping voltage is input to the pump circuit 40 (step S506). The pump circuit 40 is brought into the active state in accordance with the input of this pumping voltage (step S507), and generates the VBB voltage (step S508). Especially the flow of procedures in steps S502, 504 to 508 mean that an appropriate VBB voltage of can be swiftly generated and supplied when the VBB voltage approaches, e.g., −1.0V and high supply ability is not required, and VBB voltage consumption is supplemented when the memory is not operated.

When the input VBB voltage is smaller than the second reference value (NO in step S504), the ring oscillator 10 is brought into a non-active state which is a suspended state (step S509). With this, the pump circuit 40 is also brought into a non-active state which is a suspended state (step S510).

As explained above, according to the substrate bias voltage generating circuit of the fifth embodiment, since the ring oscillator 10 is provided therein with the tuning mechanism of oscillation frequency (delay amount), especially a mechanism for controlling a gate voltage value of the MOS transistor which limits the current of the delay group, the same operation as the second embodiment can be carried out, and the same effect as the second embodiment can be obtained.

Next, a substrate bias voltage generating circuit of the sixth embodiment will be explained. The substrate bias voltage generating circuit of the sixth embodiment includes another ring oscillator different from that shown in FIG. 5. Therefore, a circuit structure of the ring oscillator will be explained below.

Figure 12:
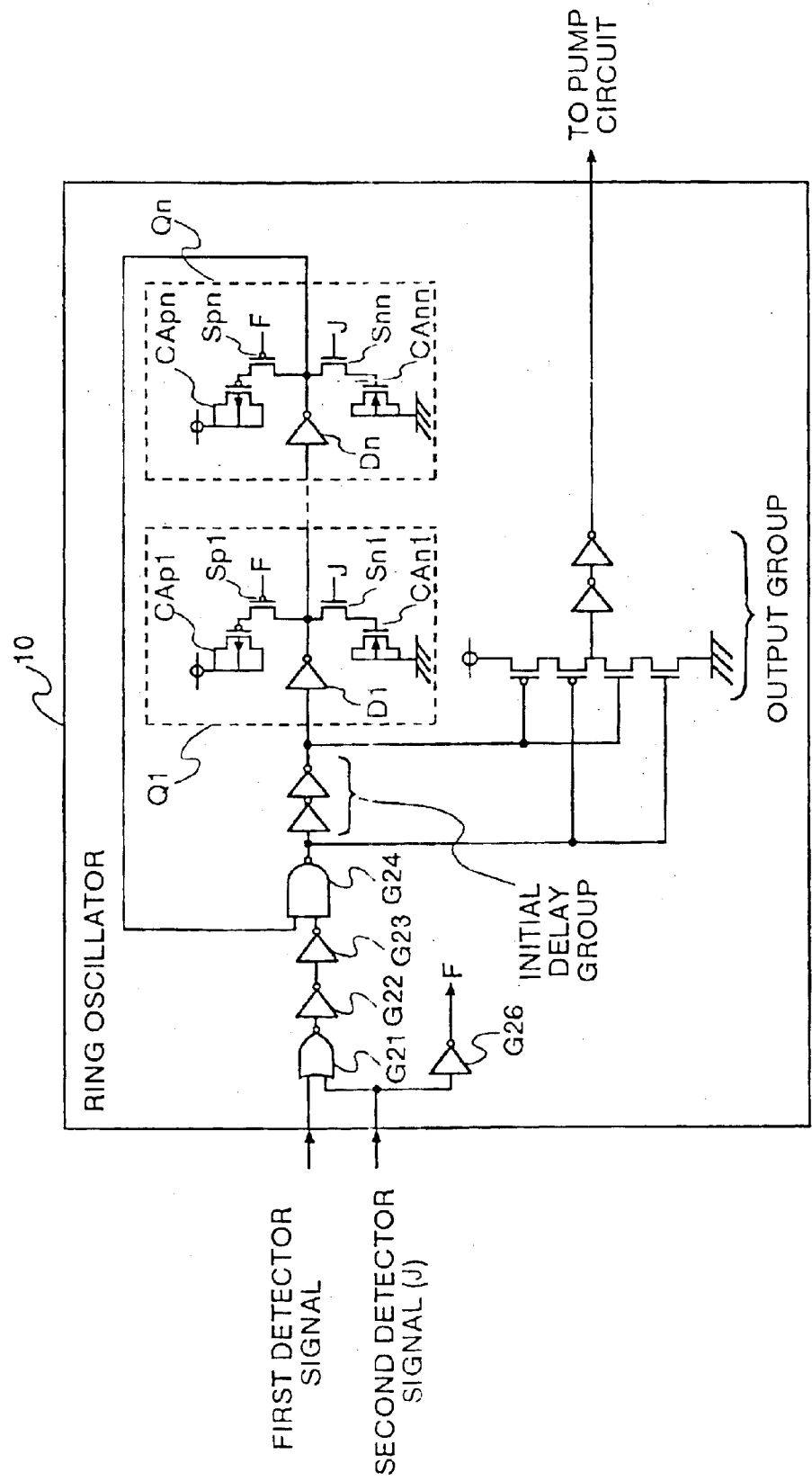
FIG. 12 is a circuit diagram of a ring oscillator 10 of a substrate bias voltage generating circuit of a sixth embodiment.

FIG. 12 is a circuit diagram of the ring oscillator 10 of the substrate bias voltage generating circuit of the sixth embodiment. Elements similar to those shown in FIG. 6 are designated with the same reference symbols, and explanation thereof is omitted. In FIG. 12, the sixth embodiment is different from that shown in FIG. 6 in that the substrate bias voltage generating circuit includes an inverter G26 for inverting a second detector signal producing a signal J and determining a result thereof as a signal F.

The sixth embodiment is different also in that the selector 30 shown in FIG. 6 is omitted, the first and second delay groups are replaced by a plurality of delay blocks Q1 to Qn. The delay block Q1 comprises an inverter D1 serially connected to the initial delay group, a PMOS transistor CAp1 functions as a capacitor on the side of a power source line, a PMOS transistor Sp1 functions as switching means for connecting the PMOS transistor CAp1 to an output of the inverter D1, an NMOS transistor CAn1 functions as a capacitor on the side of a ground line, and a PMOS transistor Sn1 functions as switching means for connecting the NMOS transistor CAn1 to the output of the inverter D1. The PMOS transistor Sp1 receives the signal F at its gate, and the NMOS transistor Sn1 receives the signal J at its gate.

That is, when the second detector signal is output, the ring oscillator 10 shown in FIG. 12 turns both the PMOS transistor Sp1 and the NMOS transistor Sn1 ON to add a gate capacitance of the PMOS transistor CAp1 and the NMOS transistor CAn1 to the output of the inverter D1. That is, it is necessary to charge and discharge by an amount corresponding to the added capacitance and, as a result, the delay amount of the delay blocks Q1 is increased. Other delay block Qn and the like have the same structures. This means that the same operation as the second embodiment can be carried out.

Figure 13:
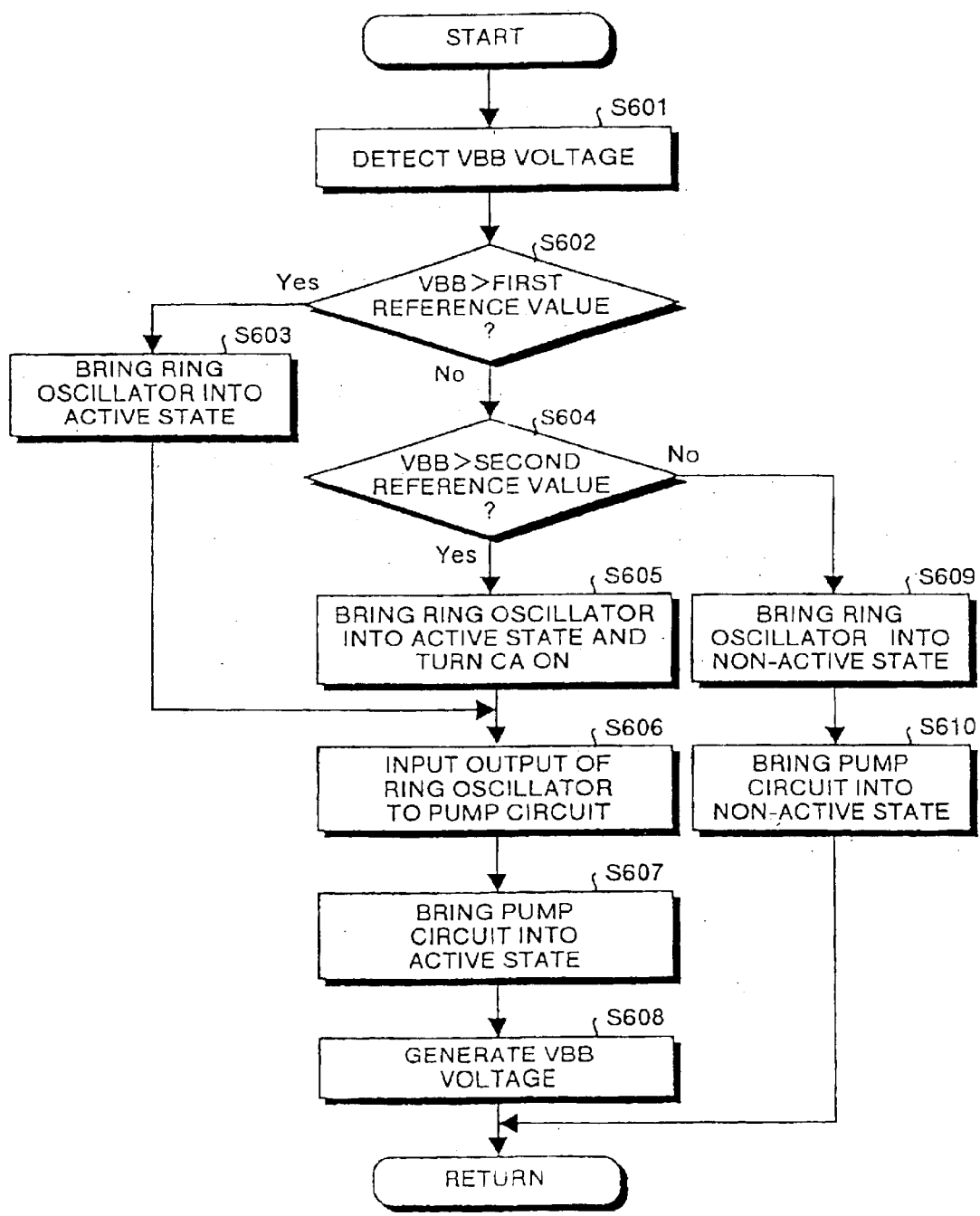
FIG. 13 is a flowchart showing the operation of the substrate bias voltage generating circuit of the sixth embodiment.

Next, the operation of the substrate bias voltage generating circuit of the sixth embodiment will be explained. FIG. 13 is a flowchart showing the operation of the substrate bias voltage generating circuit of the sixth embodiment. First, in the substrate bias voltage generating circuit, VBB voltage is input to the first detector circuit 11 and the second detector circuit 21 to detect the VBB voltage (step S601).

In the first detector circuit 11, if it is detected that the input VBB voltage is greater than the first reference value (e.g., –0.8V) (YES in step S602), the first detector circuit 11 outputs the first detector signal of logical level "H". This first detector signal is input to the ring oscillator 10. With this operation, the ring oscillator 10 is brought into the active state (step S603).

That is, the signal F assumes logic level "H", and the signal J assumes logic level "L". Therefore, the PMOS transistors Sp1 to Spn as well as the NMOS transistors Sn1 to Snn are turned OFF, and the gate capacitance of the PMOS transistors CAp1 to CApn and the NMOS transistors CAn1 to CAnn is not added to the outputs of the inverters D1 to Dn. Therefore, the pumping voltage is generated based on the oscillation frequency (delay amount) which is determined by the inverters D1 to Dn. This pumping voltage is input to the pump circuit 40 (step S606). The pump circuit 40 is brought into the active state in accordance with the input of this pumping voltage (step S607), and generates the VBB voltage (step S608).

Especially the flow of procedures in steps S602, 603, 606 to 608 means that a VBB voltage of –1.0V, e.g., can be swiftly generated and supplied when high supply ability of voltage substrate bias voltage is required, e.g., at power-on or at the time of operation of the memory.

On the other hand, if it is detected that the input VBB voltage is greater than the second reference value (e.g., –1.0V), the second detector circuit 21 outputs a second detector signal of logic level "H" (NO in step S602 and YES in step S604). This second detector signal is input to the ring oscillator 10. That is, the signal F assumes logic level "L", and the signal J assumes logic level "H". Therefore, the PMOS transistors Sp1 to Spn as well as the NMOS transistors Sn1 to Snn are turned ON, and the gate capacitance of the PMOS transistors CAp1 to CApn and the NMOS transistors CAn1 to CAnn is added to the outputs of the inverters D1 to Dn (step S605). Therefore, the pumping voltage is generated based on the delay amount which is determined by the inverters D1 to Dn and the gate capacitance. This pumping voltage is input to the pump circuit 40 (step S606). The pump circuit 40 is brought into the active state in accordance with the input of this pumping voltage (step S607), and generates the VBB voltage (step S608).

Especially the flow of procedures in steps S602, 604 to 608 means that an appropriate VBB voltage of can be swiftly generated and supplied when the VBB voltage approaches, e.g., –1.0V and high supply ability is not required, and VBB voltage consumption is supplemented when the memory is not operated.

When the input VBB voltage is smaller than the second reference value (NO in step S604), the ring oscillator 10 is brought into a non-active state which is a suspended state (step S609). With this, the pump circuit 40 is also brought into a non-active state which is a suspended state (step S610).

As explained above, according to the substrate bias voltage generating circuit of the sixth embodiment, since the ring oscillator 10 is provided therein with the tuning mechanism of oscillation frequency (delay amount), especially a mechanism for adding capacitance, the same operation as the second embodiment can be carried out, and the same effect as the second embodiment can be obtained.

Next, a substrate bias voltage generating circuit of the seventh embodiment will be explained. The substrate bias voltage generating circuit of the seventh embodiment includes another ring oscillator different from that shown in FIG. 12. Therefore, a circuit structure of the ring oscillator will be explained below.

Figure 14:
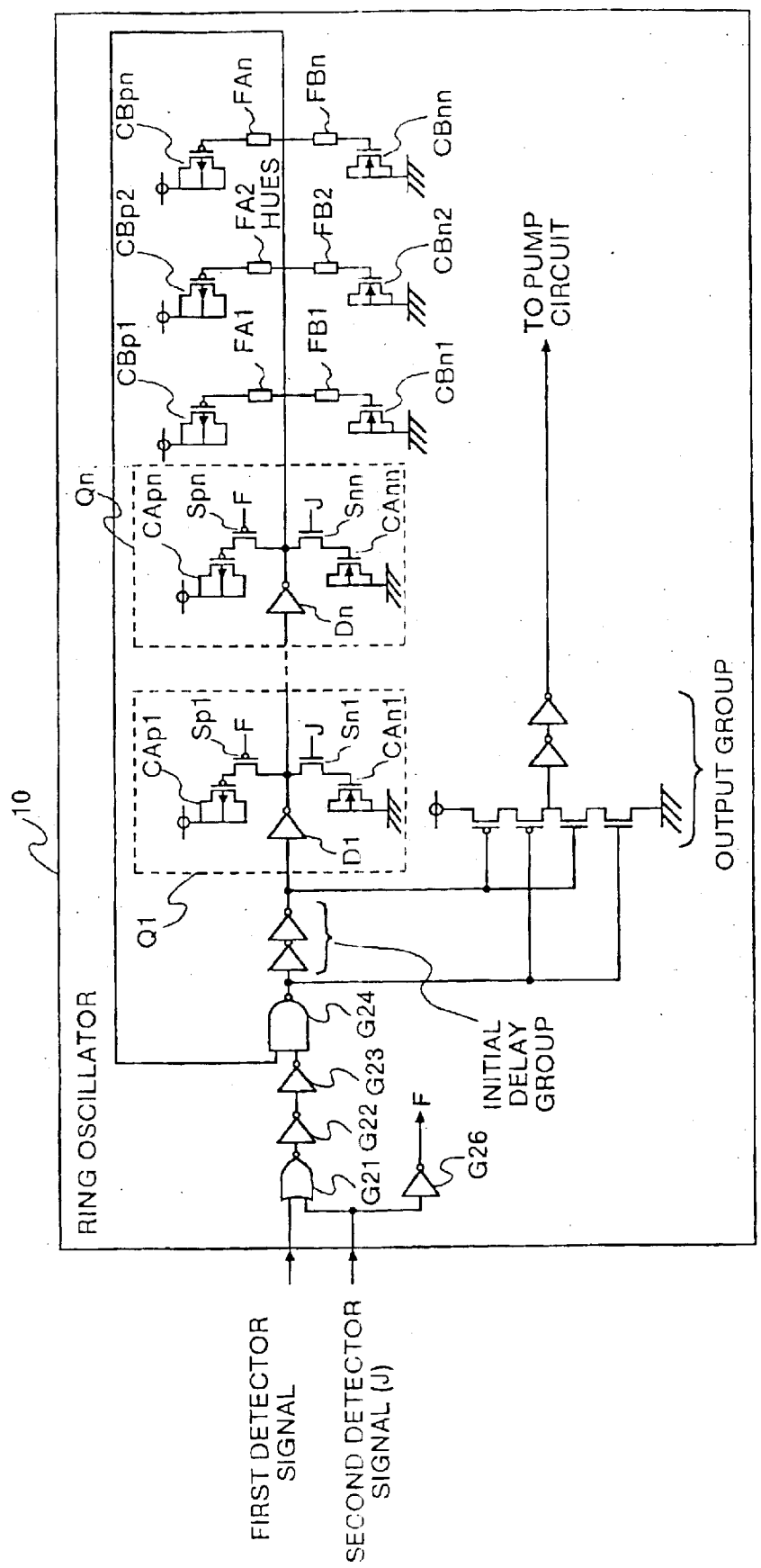
FIG. 14 is a circuit diagram of the ring oscillator 10 of a substrate bias voltage generating circuit of a seventh embodiment.

FIG. 14 is a circuit diagram of the ring oscillator 10 of the substrate bias voltage generating circuit of the seventh embodiment. Elements similar to those shown in FIG. 12 are designated with the same reference symbols, and explanation thereof is omitted. In FIG. 14, the seventh embodiment is different from that shown in FIG. 12 in that an output portion of the last delay block Qn is provided with an LT (laser trimming) block.

In FIG. 14, the LT (laser trimming) block comprises a PMOS transistor CBp1 which functions as a capacitor on the side of a power source line, a fuse FA1 for connecting the PMOS transistor CBp1 to the output portion of the delay block Qn, an NMOS transistor CBn1 which functions as a capacitor on the side of a ground line, and a fuse FB1 for connecting the NMOS transistor CBn1 to the output portion of the delay block Qn.

That is, according to the ring oscillator 10 shown in FIG. 14, it is possible to reduce the gate capacitance to be added to the output portion of the delay block Qn by cutting the fuse of the LT block by an LT method. This is effective when it is desired to adjust the delay amount of the delay group in addition to the operation of the sixth embodiment. A plurality of LT groups constituting the LT block may be provided as illustrated.

The above-described LT method is carried out with timing different from the action of the common constituting elements in the sixth embodiment. Therefore, the explanation of the operation of the substrate bias voltage generating circuit according to the seventh embodiment is be omitted.

As explained above, according to the substrate bias voltage generating circuit of the seventh embodiment, since the ring oscillator 10 is provided therein with the tuning mechanism for oscillation frequency (delay amount), especially a mechanism which adds capacitance and which has the LT block, the same operation as the second embodiment can be carried out, and the same effect as the second embodiment can be obtained. Especially, when the VBB voltage supplying ability becomes excessively large and a voltage to be applied to the memory substrate becomes excessively small, or when the VBB voltage supplying ability is too low and the voltage to be applied to the memory substrate can not be reduced, if the LT block is present, it is possible to save substrate bias voltage generating circuits or chips having the substrate bias voltage generating circuits which were assumed as being defective heretofore, and the yield can be enhanced.

Next, a substrate bias voltage generating circuit of the eighth embodiment will be explained. The substrate bias voltage generating circuit of the eighth embodiment includes another ring oscillator different from that shown in FIG. 5. Therefore, a circuit structure of the ring oscillator will be explained below.

Figure 15:
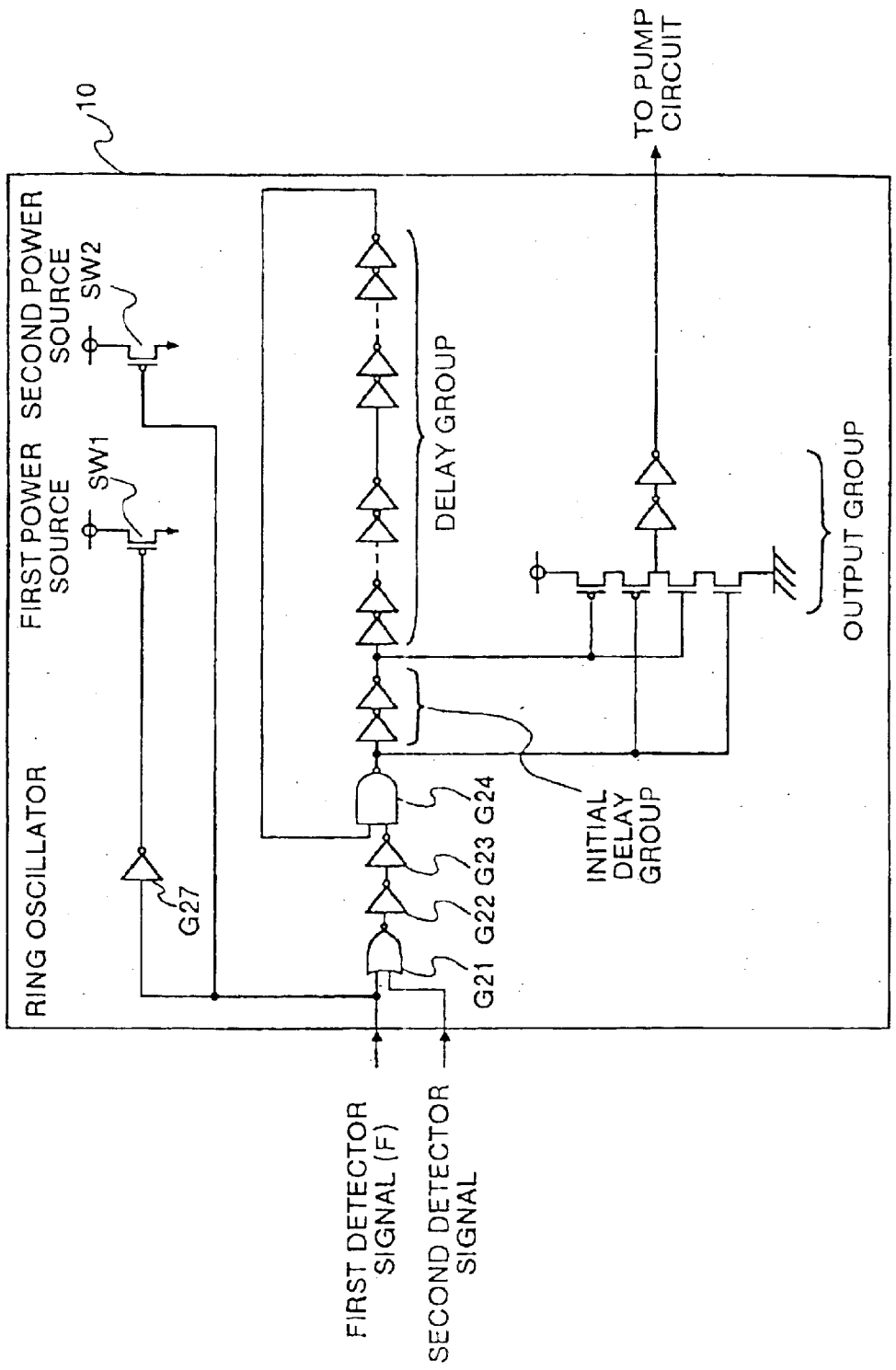
FIG. 15 is a circuit diagram of the ring oscillator 10 of a substrate bias voltage generating circuit of an eighth embodiment.

FIG. 15 is a circuit diagram of the ring oscillator 10 of the substrate bias voltage generating circuit of the eighth embodiment. Elements similar to those shown in FIG. 6 are designated with the same reference symbols, and explanation thereof is omitted. In FIG. 15, the eighth embodiment is different from that shown in FIG. 6 in that the selector 30 is omitted, and the substrate bias voltage generating circuit includes an inverter G27 for inverting the first detector signal, a PMOS transistor SW1 for supplying a first power source voltage, and a PMOS transistor SW2 for supplying a second power source voltage.

The PMOS transistor SW2 inputs the first detector signal (F) to a gate, and the PMOS transistor SW1 inputs the output of the inverter G27 to a gate. Here, the first power source voltage is greater than the second power source voltage. Especially, drains of the PMOS transistors SW1 and SW2 are connected to all or one of power source voltage input terminals constituting the ring oscillator 10. This structure means that the first detector signal controls both the first and second power source voltages.

That is, the ring oscillator 10 shown in FIG. 15 supplies the first power source voltage to the logic gate when a first detector signal of logic level "H" is output, and supplies the second power source voltage to the logic gate when a second detector signal of logic level "H" is output. The magnitude of the power source voltage determines the oscillation frequency (delay amount) of the ring oscillator 10. That is, when the first power source voltage is supplied, the delay amount becomes smaller as compared with a case in which the second power source voltage is supplied. This means that the same operation as the second embodiment is realized.

Figure 16:
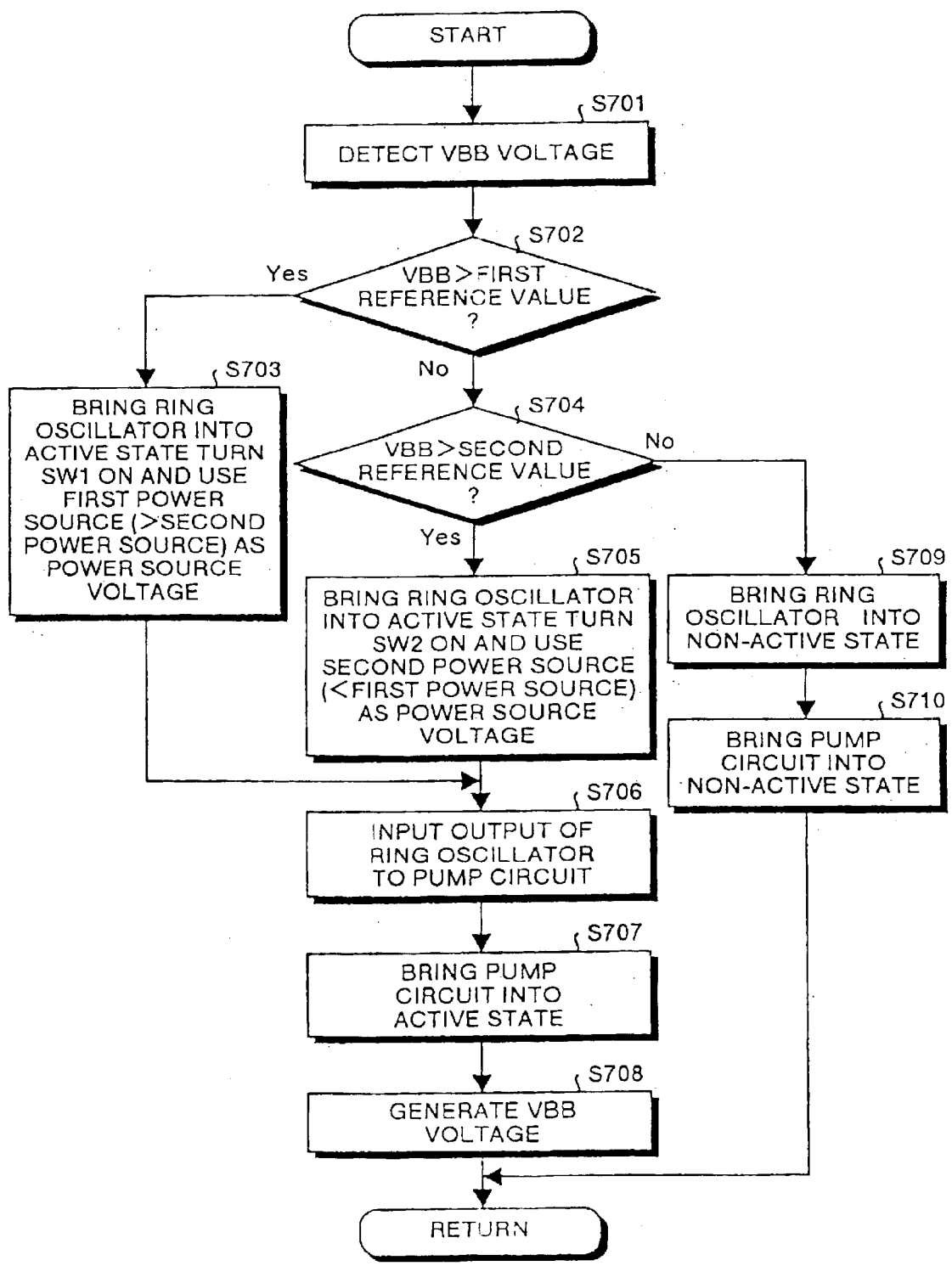
FIG. 16 is a flowchart showing the operation of the substrate bias voltage generating circuit of the eighth embodiment.

Next, the operation of the substrate bias voltage generating circuit of the eighth embodiment will be explained. FIG. 16 is a flowchart showing the operation of the substrate bias voltage generating circuit of the eighth embodiment. First, in the substrate bias voltage generating circuit, VBB voltage is input to the first detector circuit 11 and the second detector circuit 21 to detect the VBB voltage (step S701).

In the first detector circuit 11, if it is detected that the input VBB voltage is greater than the first reference value (e.g., –0.8V) (YES in step S702), the first detector circuit 11 outputs the first detector signal of logical level "H". This first detector signal is input to the ring oscillator 10. With this operation, the ring oscillator 10 is brought into the active state, the PMOS transistor SW1 is turned ON, and the first power source voltage is supplied to each logic gate (step S703).

The pumping voltage is generated based on the oscillation frequency (delay amount) by the supplied first power source voltage. This pumping voltage is input to the pump circuit 40 (step S706). The pump circuit 40 is brought into the active state in accordance with the input of this pumping voltage (step S707), and generates the VBB voltage (step S708). Especially the flow of procedures in steps S702, 703, 706 to 708 means that a VBB voltage of –1.0V, e.g., can be swiftly generated and supplied when high supply ability of voltage substrate bias voltage is required, e.g., at power-on or at the time of operation of the memory.

On the other hand, if it is detected that the input VBB voltage is greater than the second reference value (e.g., –1.0V), the second detector circuit 21 outputs a second detector signal of logic level "H" (NO in step S702 and YES in step S704). This second detector signal is input to the ring oscillator 10. With this operation, the ring oscillator 10 is brought into the active state, the PMOS transistor SW2 is turned ON, and the second power source voltage is supplied to each logic gate (step S705).

The pumping voltage is generated based on the oscillation frequency (delay amount) by the supplied second power source voltage. This pumping voltage is input to the pump circuit 40 (step S706). The pump circuit 40 is brought into the active state in accordance with the input of this pumping voltage (step S707), and generates the VBB voltage (step S708). Especially the flow of procedures in steps S702, 704 to 708 means that an appropriate VBB voltage of can be swiftly generated and supplied when the VBB voltage approaches, e.g., –1.0V and high supply ability is not required, and VBB voltage consumption is supplemented when the memory is not operated.

When the input VBB voltage is smaller than the second reference value (NO in step S704), the ring oscillator 10 is brought into a non-active state which is a suspended state (step S709). With this, the pump circuit 40 is also brought into a non-active state which is a suspended state (step S710).

As explained above, according to the substrate bias voltage generating circuit of the eighth embodiment, since the ring oscillator 10 is provided therein with the tuning mechanism of oscillation frequency (delay amount), especially a mechanism for controlling the power source voltage of the logic gates constituting the ring oscillator 10, the same operation as the second embodiment can be carried out, and the same effect as the second embodiment can be obtained.

Figure 17:
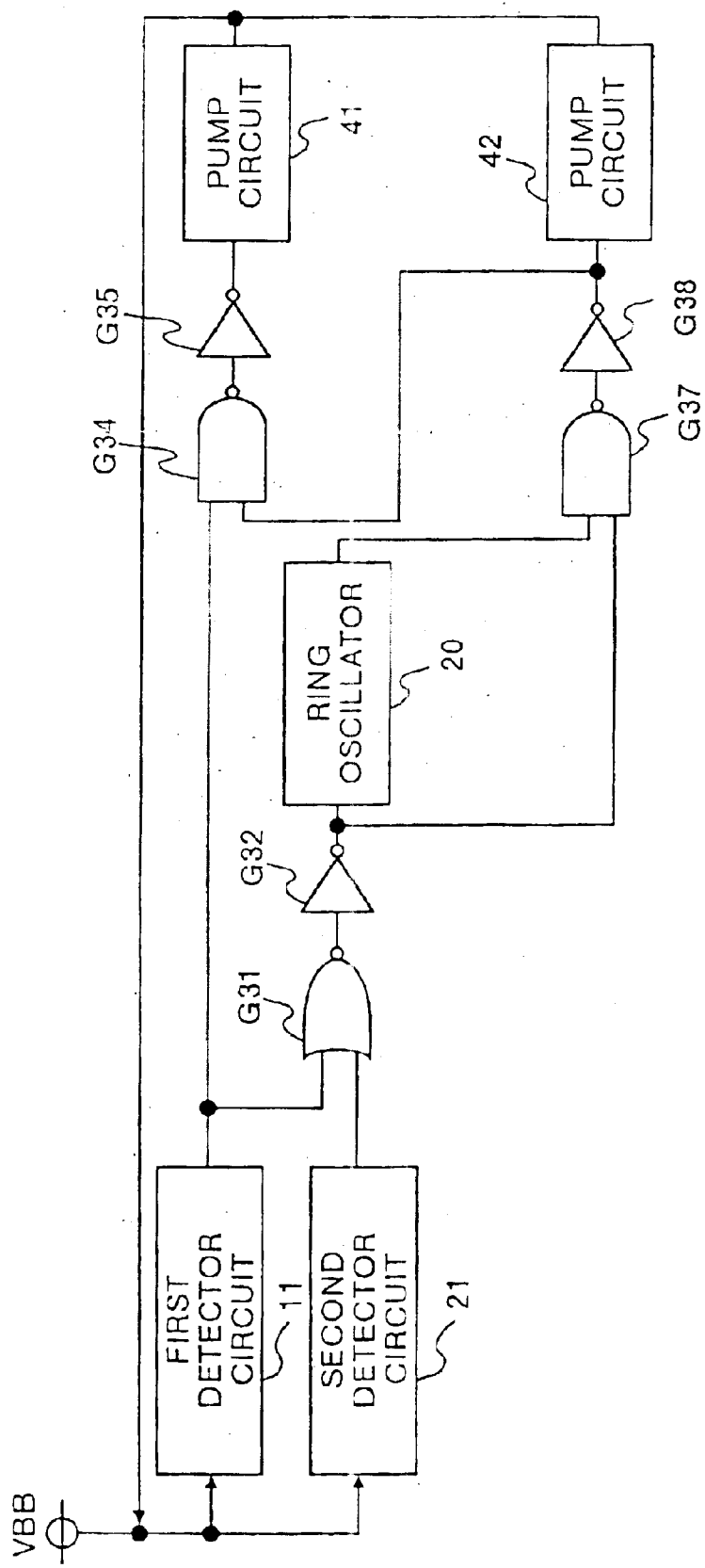
FIG. 17 is a schematic block diagram a structure of a substrate bias voltage generating circuit according to a ninth embodiment.

Next, a substrate bias voltage generating circuit of the ninth embodiment will be explained. FIG. 17 is a schematic block diagram a structure of a substrate bias voltage generating circuit according to the ninth embodiment. The substrate bias voltage generating circuit shown in FIG. 17 comprises a first detector circuit 11 for self-detecting that a VBB voltage is greater than a first reference value, a second detector circuit 21 for self-detecting that the VBB voltage is equal to or smaller than the first reference value, a ring oscillator 20, and pump circuits 41 and 42 having the same VBB voltage supplying abilities. Especially, each of the pump circuits 41 and 42 has one-half the supplying ability of the pump circuit 40 shown in the first embodiment. The ring oscillator 20 has the same structure as the conventional ring oscillator.

The substrate bias voltage generating circuit shown in FIG. 17 comprises a NOR gate G31, inverter G32, G35 and G38, and NAND gates G34 and G37. The NOR gate G31 receives first and second detector signals, the inverter G32 inverts an output of the NOR gate G31 and inputs the same to the ring oscillator 20.

The inverter G35 inverts an output of the NAND gate G34 and inputs the result to the pump circuit 41, and the inverter G38 inverts an output of the NAND gate G37 and inputs the result to the pump circuit 42. The first detector signal is input to one of input terminals of the NAND gate G34, and the output of the inverter G38 is input to the other input terminal. An output of the inverter G32 is input to one of input terminals of the NAND gate G37, and the output of the ring oscillator 20 is input to the other input terminal.

That is, the substrate bias voltage generating circuit of the ninth embodiment changes the number of operating pump circuits in accordance with the detection result of the VBB voltage.

Figure 18:
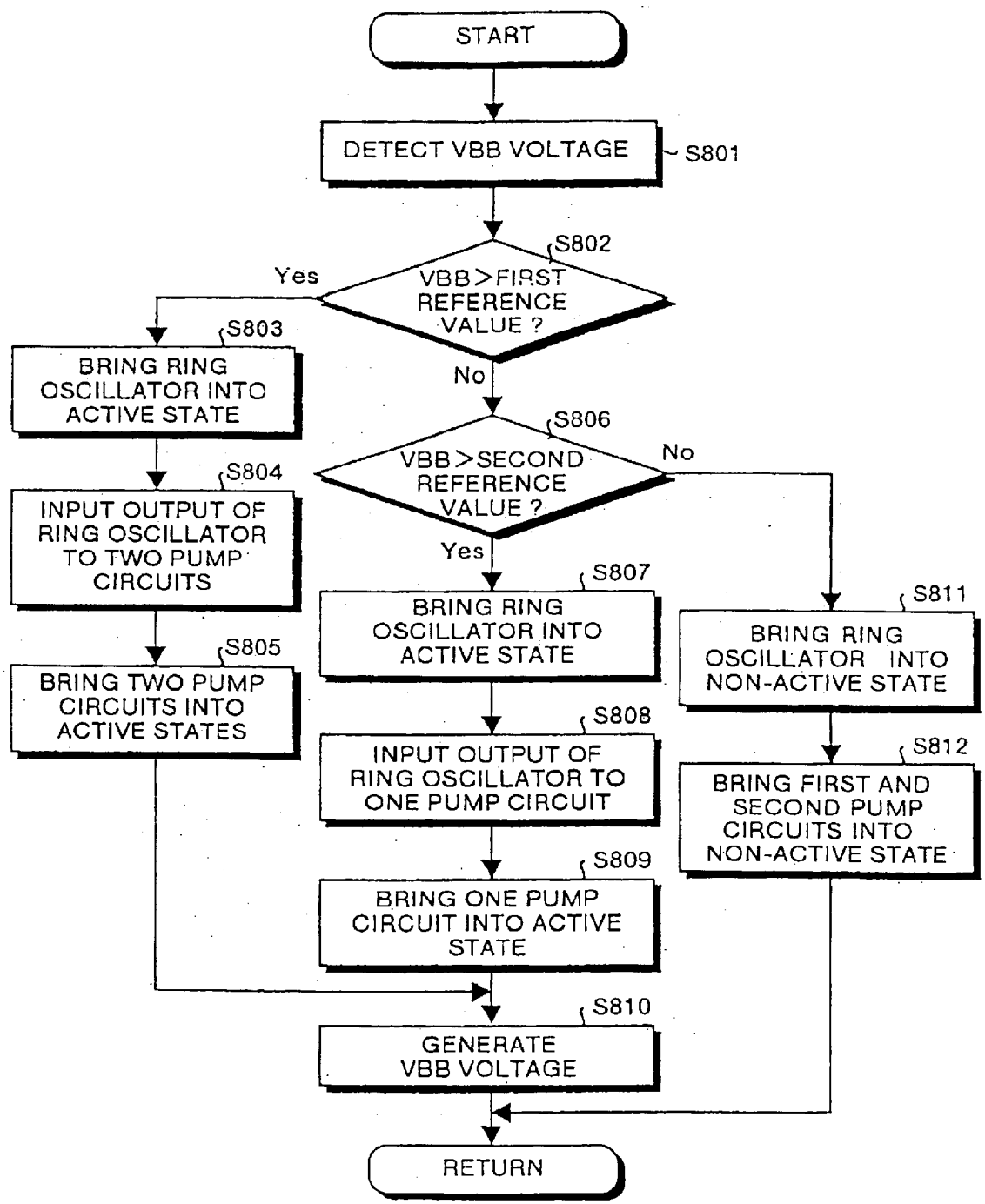
FIG. 18 is a flowchart showing the operation of the substrate bias voltage generating circuit of the ninth embodiment.

Next, the operation of the substrate bias voltage generating circuit of the ninth embodiment will be explained. FIG. 18 is a flowchart showing the operation of the substrate bias voltage generating circuit of the ninth embodiment. First, in the substrate bias voltage generating circuit, VBB voltage is input to the first detector circuit 11 and the second detector circuit 21 to detect the VBB voltage (step S801).

In the first detector circuit 11, if it is detected that the input VBB voltage is greater than the first reference value (e.g., −0.8V) (YES in step S802), the first detector circuit 11 outputs the first detector signal of logical level "H". This first detector signal is input to one of input terminals of the NOR gate G31. Here, the NOR gate G31 outputs a signal of logic level "L" irrespective of a signal state of the other input terminal. This signal of logic level "L" is inverted in the inverter G32 and input to the ring oscillator 20. With this operation, the ring oscillator 20 is brought into the active state (step S803).

Therefore, the output of the ring oscillator 20, i.e., the pumping voltage is input to the other input terminal of the NAND gate G37. As a result, the NAND gate G37 transmits the pumping voltage to the inverter G38. The inverter G38 inverts the input pumping voltage and inputs the same to the pump circuit 42 (step S804).

The NAND gate G34 receives the first detector signal of logic level "H" at one of input terminals, and receives an output of the inverter G38, i.e., the pumping voltage, at the other input terminal. The pumping voltage is inverted in the inverter G35 and input to the pump circuit 41 (step S804). That is, when the first detector signal is of logic level "H", both the two pump circuits 41 and 42 are brought into the active state in accordance with the pumping voltage output from the ring oscillator 20 (step S805). The pump circuits 41 and 42 generate the VBB voltage (step S810).

Especially the flow of procedures in steps S802 to 805, 810 means that a VBB voltage of −1.0V, e.g., can be swiftly generated and supplied when high supply ability of voltage substrate bias voltage is required, e.g., at power-on or at the time of operation of the memory.

On the other hand, if it is detected that the input VBB voltage is greater than the second reference value (e.g., −1.0V), the second detector circuit 21 outputs a second detector signal of logic level "H" (NO in step S802 and YES in step S806). This second detector signal is input to one of the input terminals of the NOR gate G31. Here, the NOR gate G31 outputs a signal of logic level "L" irrespective of a signal state of the other input terminal. This signal of logic level "L" is inverted in the inverter G32 and input to the ring oscillator 20. With this operation, the ring oscillator 20 is brought into the active state (step S807).

Therefore, the output of the ring oscillator 20, i.e., the pumping voltage is input to one of the input terminals of the NAND gate G37. Here, since the output of the inverter G32 is of logic level "H", as a result, the NAND gate G37 transmits the pumping voltage output from the ring oscillator 20 to the inverter G38 consequently. The inverter G38 inverts the input pumping voltage and inputs the same to the pump circuit 42 (step S808).

Here, since the first detector signal is of logic level "L", the NAND gate G34 outputs a signal of logic level "H" irrespective of a signal state of the other input terminal. This signal of logic level "H" is inverted in the inverter G35 and input to the pump circuit 41, but the pump circuit 41 is not brought into the active state. That is, when the second detector signal is of logic level "H", only the pump circuit 42 is brought into the active state in accordance with the pumping voltage output from the ring oscillator 20 (step S809). The pump circuit 42 generates the VBB voltage (step S810).

Especially the flow of procedures in steps S802, 806 to 810 means that an appropriate VBB voltage of can be swiftly generated and supplied when the VBB voltage approaches, e.g., −1.0V and high supply ability is not required, and VBB voltage consumption is supplemented when the memory is not operated.

When the input VBB voltage is smaller than the second reference value (NO in step S806), the ring oscillator 10 is brought into a non-active state which is a suspended state (step S811). With this, the pump circuits 41 and 42 are also brought into a non-active state which is a suspended state (step S812).

As explained above, the substrate bias voltage generating circuit of the ninth embodiment comprises the ring oscillator and the two pump circuits, and has the same functions as the first and second ring oscillators. Therefore, this substrate bias voltage generating circuit has the effect of the first embodiment. Further, when the VBB voltage is increased toward the negative side, a portion of the circuits is not operated and thus, the current consumption can be reduced. Further, it is only necessary to design one ring oscillator and one pump circuit, so it is possible to shorten time required for circuit design.

Figure 19A:
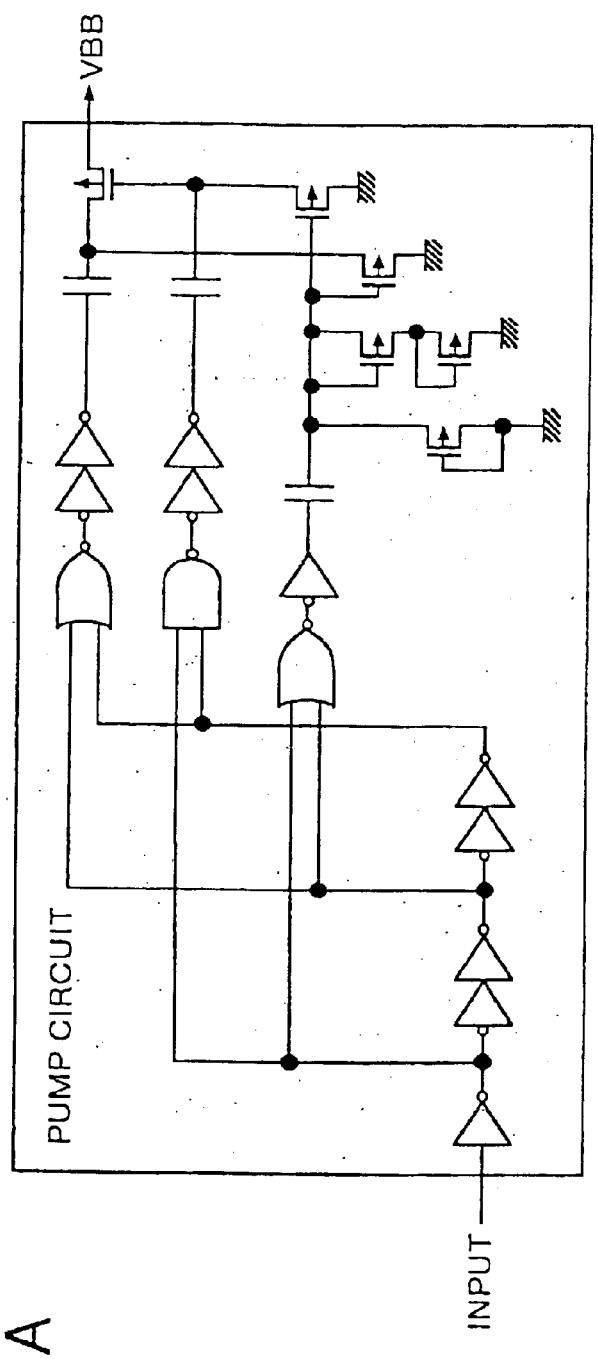
FIG. 19A and FIG. 19B are circuit diagrams of a pump circuit of a substrate bias voltage generating circuit of a tenth embodiment.

Next, a substrate bias voltage generating circuit of the tenth embodiment will be explained. The substrate bias voltage generating circuit of the tenth embodiment is for explaining an example of the pump circuit of each of the above embodiments. FIG. 19A is a circuit diagram of a pump circuit of a substrate bias voltage generating circuit of the tenth embodiment. The pump circuit shown in FIG. 19A is a single boost type pump circuit. Since the circuit structure itself is the same as a conventional circuit, explanation thereof is omitted.

Figure 19B:
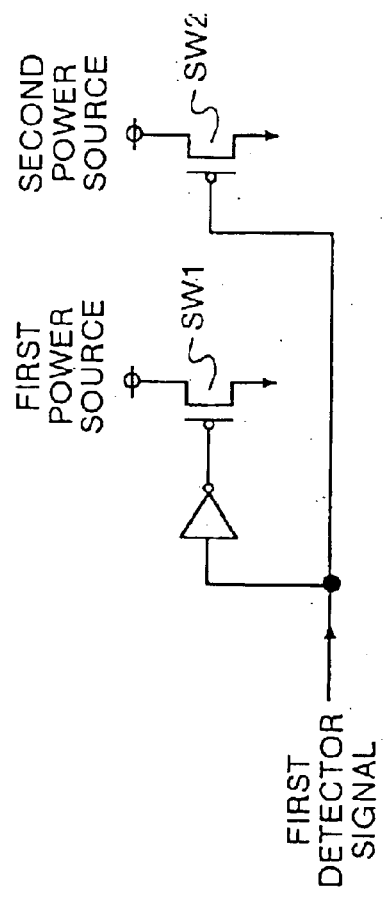

The tenth embodiment is characterized in that a supply voltage of each of logic gates shown in FIG. 19A is changed in accordance with a first detector signal like the eighth embodiment. FIG. 19B is a circuit diagram for changing the supply voltage. Since the operation of the circuit is the same as that of the eighth embodiment, explanation thereof is omitted.

As explained above, according to the substrate bias voltage generating circuit of the tenth embodiment, since the pump circuit is provided therein with the tuning mechanism of oscillation frequency (delay amount), especially a mechanism for controlling the power source voltage of the logic gates constituting the pump circuit, the same operation as the second embodiment can be carried out, and the same effect as the second embodiment can be obtained.

Figure 20:
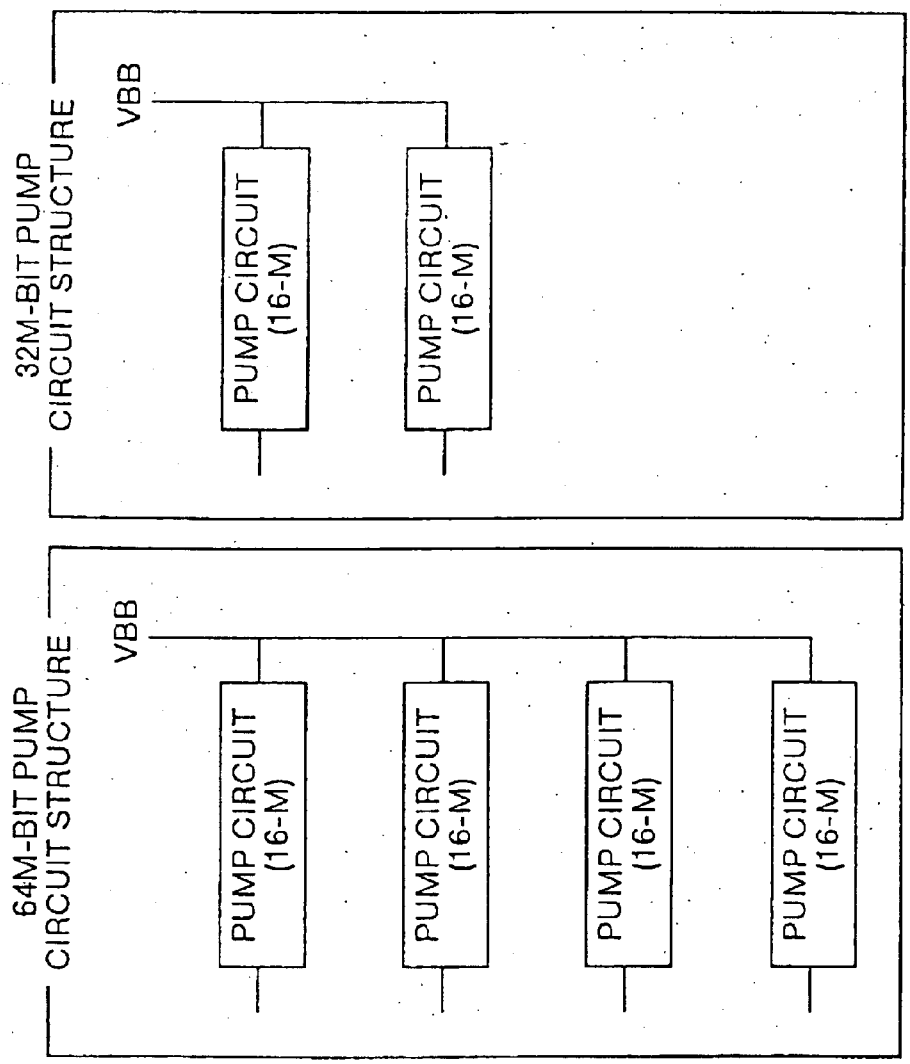
FIG. 20 is an explanatory diagram for explaining an example of a module structure of a substrate bias voltage generating circuit of an eleventh embodiment.

Next, a substrate bias voltage generating circuit of the eleventh embodiment will be explained. The substrate bias voltage generating circuit of the eleventh embodiment is for explaining an example of a module structure in which a plurality of small pump circuits are arranged in parallel such that the number of pump circuits can be changed. FIG. 20 is an explanatory diagram for explaining the example of the module structure of the substrate bias voltage generating circuit of the eleventh embodiment. As shown in FIG. 20, a pump circuit corresponding to a 16 M-bit DRAM is designed. If a 32 M-bit DRAM is employed, two pump circuits are prepared from the DRAM. If a 64 M-bit DRAM is employed, four pump circuits are prepared from the DRAM.

As explained above, according to the substrate bias voltage generating circuit of the eleventh embodiment, since a modular structure is used in which a plurality of pump circuits are connected in parallel in accordance with the capacity of the memory from which the pump circuits are derived, it is only necessary to design one pump circuit, and it is possible to shorten the period of circuit designing. Further, even if various memory capacities are required, like an ASIC incorporating a memory incorporated ASIC, it is unnecessary to again design every time, and in this case also, it is possible to shorten the period of designing. Further, even if various memory capacities are required like the memory incorporated ASIC, it is unnecessary to again design every time, and in this case also, it is possible to shorten a period of time during designing.

Figure 21:
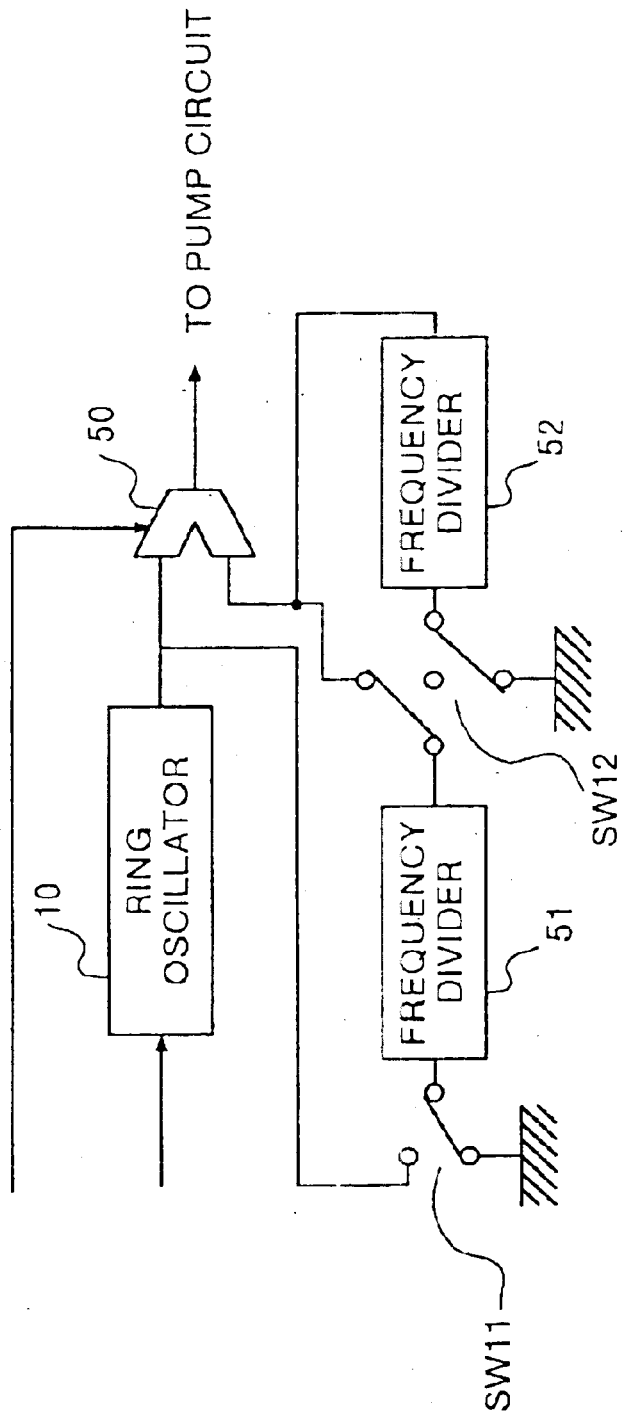
FIG. 21 is a diagram showing a portion of a substrate bias voltage generating circuit of a twelfth embodiment.

Next, a substrate bias voltage generating circuit of a twelfth embodiment will be explained. FIG. 21 is a diagram showing a portion of the substrate bias voltage generating circuit of the twelfth embodiment. FIG. 21 shows a module structure in which oscillation frequency (delay amount) can be tuned in accordance with a capacity of a memory by serially connecting a frequency divider to a ring oscillator. For example, when the capacity of the memory is 64 M-bit, a pumping voltage output from a ring oscillator 10 is input to a pump circuit through a selector 50 without passing through the frequency divider.

The oscillation frequency is tuned through one frequency divider 51 when the capacity of the memory is 32 M-bit, and through frequency dividers 51 and 52 when the capacity of the memory is 16 M-bit. The connection between the frequency dividers 51 and 52 is switched using switches SW11 and SW12 as shown in figure.

As described above, according to the substrate bias voltage generating circuit of the twelfth embodiment, if the frequency divider and the ring oscillator are designed one by one, it is unnecessary to again design memory capacity corresponding to the number of frequency dividers, and it is possible to shorten a period of time during designing.

A substrate bias voltage generating circuit of a thirteenth embodiment will be explained. The substrate bias voltage generating circuit of the thirteenth embodiment is characterized in that a plurality of detector circuits for detecting the VBB voltage commonly use an LT (laser trimming) circuit.

Figure 22:
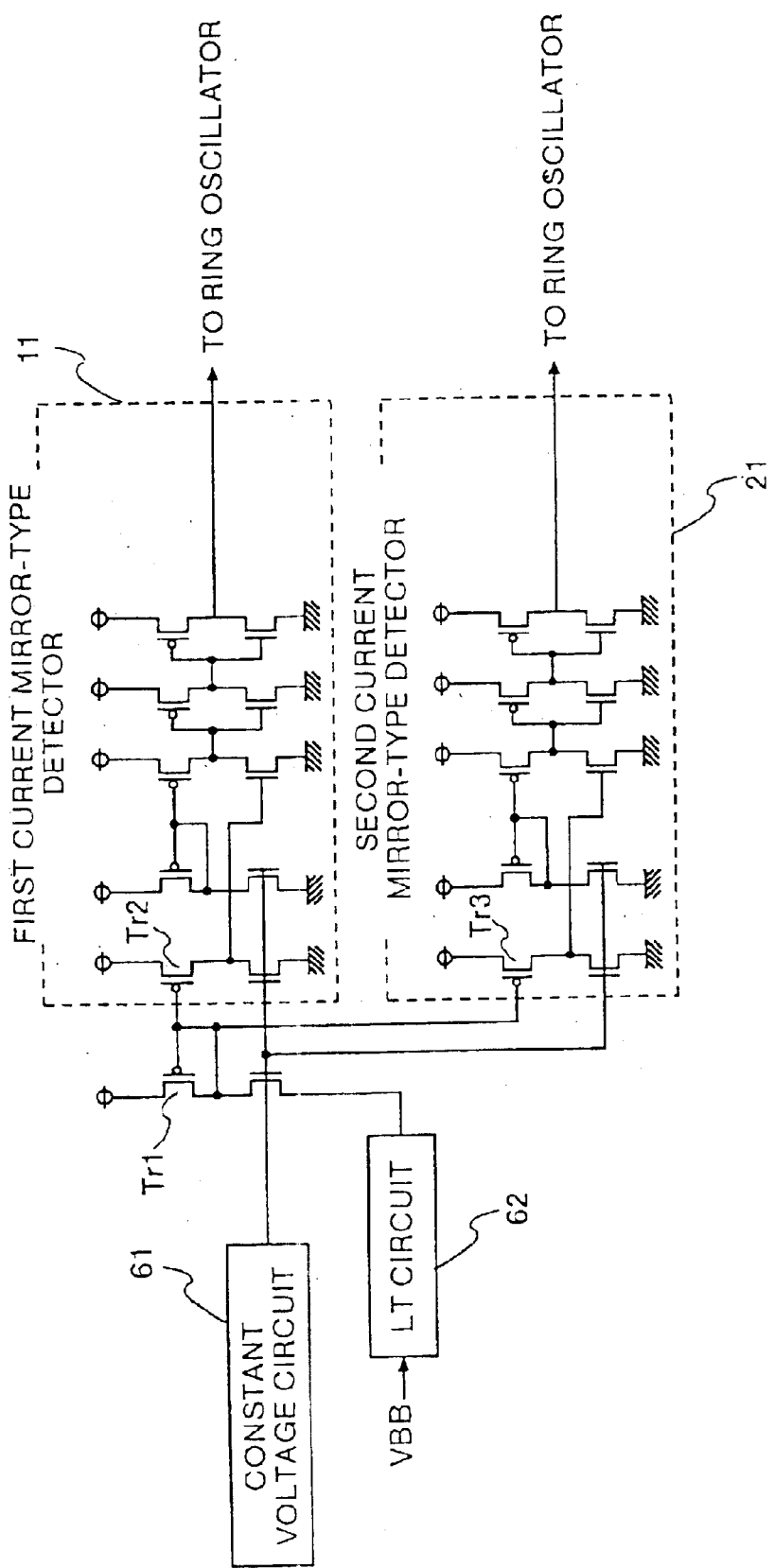
FIG. 22 is a detector circuit of a substrate bias voltage generating circuit of a thirteenth embodiment.

FIG. 22 is a detector circuit of the substrate bias voltage generating circuit of the thirteenth embodiment. As shown in FIG. 22, a first current mirror type detector 11 and a second current mirror type detector circuit 21 commonly uses an LT circuit 62. When detector circuits having different detection levels are separately provided, it is also necessary to separately prepare the LT circuits for the detector circuits, but if the number of the detector circuits is increased, an area of the LT circuit is increased, and it takes time to test the circuit.

Thereupon, in the thirteenth embodiment, as shown in FIG. 22, a pair of current mirrors between a PMOS transistor Tr1 connected to the common LT circuit 62 and a PMOS transistor Tr2 of the first current mirror type detector 11, and a pair of current mirrors between the PMOS transistor Tr1 and a PMOS transistor Tr3 of the second current mirror type detector circuit 21 are designed such that the mirror ratios are different. With this design, it is possible to commonly use the LT circuit 62.

If the detectors are connected in parallel, the occupied area becomes small, and the test time can be shortened. There is no problem in precision of the detection level because all the detectors are deviated in the same direction.

In the above-described first to thirteenth embodiments, in order to simplify the explanation, the number of each of the plurality of detector circuit and the plurality of ring oscillator and the plurality of pump circuits is indicated as two, but it goes without saying that the number may be three or more. A portion of concept for producing the substrate bias voltage explained in the first to thirteenth embodiments can also be applied to a booster circuit.

As explained above, according to one aspect of the present invention, oscillation outputs which were output in a plurality of detector circuits and which are different between detection signals are obtained from ring oscillators corresponding to detector circuits, and one of the oscillation outputs selected by a selector is output. Therefore, one pump circuit can be commonly used, and there is an effect that a size of the circuit, current consumption and a period of time during designing can be reduced.

According to another aspect of the invention, different oscillation outputs corresponding to the plurality of detector circuits are generated by one ring oscillator and at least one frequency divider and thus, a plurality of ring oscillators are unnecessary, and there is an effect that a size of the circuit, current consumption and a period of time during designing can be reduced.

According to another aspect of the invention, the plurality of different detection signals are input in the one ring oscillator, and the position of the delay group for taking out the oscillation output is moved in accordance with the input detection signal to switch the number of delay groups. With this feature, the delay amount of the delay group, i.e., the oscillation frequency of the oscillation output can be changed, and there is an effect that a size of the circuit, current consumption and a period of time during designing can be reduced.

According to another aspect of the invention, the plurality of different detection signals are input to the one current limiting-type ring oscillator, and the transistor for changing the current amount of the delay group is ON/OFF controlled in accordance with the input detection signal. Therefore, the delay amount of the delay group, i.e., the oscillation frequency of the oscillation output can be changed, and there is an effect that a size of the circuit, current consumption and a period of time during designing can be reduced.

According to another aspect of the invention, the plurality of different detection signals are input to the one current limiting-type ring oscillator, and all of the plurality of delay groups or a portion of current amount is changed in accordance with the input detection signal. Therefore, the delay amount of the delay group, i.e., the oscillation frequency of the oscillation output can be changed more finely, and there is an effect that a size of the circuit, current consumption and a period of time during designing can be reduced.

According to another aspect of the invention, the plurality of different detection signals are input to the one ring current limiting-type oscillator, a different voltage is applied to the gate of the transistor which changes the current amount of the delay group in accordance with the input detection signal. Therefore, the delay amount of the delay group, i.e., the oscillation frequency of the oscillation output can be changed, and there is an effect that a size of the circuit, current consumption and a period of time during designing can be reduced.

According to another aspect of the invention, the plurality of different detection signals are input to the one ring oscillator, the capacitor connected to the delay group is cut off in accordance with the input detection signal. Therefore, the delay amount of the delay group, i.e., the oscillation frequency of the oscillation output can be changed, and there is an effect that a size of the circuit, current consumption and a period of time during designing can be reduced.

According to another aspect of the invention, the plurality of different detection signals are input to the one ring oscillator, all or a portion of capacitors connected to the delay group is cut off in accordance with the input detection signal. Therefore, the delay amount of the delay group, i.e., the oscillation frequency of the oscillation output can be changed more finely, and there is an effect that a size of the circuit, current consumption and a period of time during designing can be reduced.

According to another aspect of the invention, the substrate bias voltage generating circuit comprises the capacitor connected to the delay group through the fuse capable of carrying out the laser trimming. Therefore, the delay amount of the delay group, i.e., the oscillation frequency of the oscillation output can be adjusted by the LT blow, and there is an effect that a size of the circuit, current consumption and a period of time during designing can be reduced.

According to another aspect of the invention, the plurality of different detection signals are input to the one current oscillator, the power source voltage to be supplied to all or a portion of the semiconductor device constituting the substrate bias voltage generating circuit is switched in accordance with the input detection signal. Therefore, the delay amount of the delay group, i.e., the oscillation frequency of the oscillation output can be changed, and there is an effect that a size of the circuit, current consumption and a period of time during designing can be reduced.

According to another aspect of the invention, the substrate bias voltage is generated by one of the plurality of pump circuits selected by the selector based on the oscillation voltage of the ring oscillator operated by the detection signal output from the detector circuit. Therefore, it is possible to supply higher substrate bias voltage using the pump circuit having the same supplying ability and relatively small supplying ability, and there is an effect that it is possible to shorten a period of time during designing, and to adjust the supplying ability of the substrate bias voltage.

According to another aspect of the invention, the plurality of pump circuits is supplied by the module structure in which the same pump circuits are arranged in parallel. Therefore, even when a pump circuit having an appropriate supplying ability is required in accordance with a memory capacity for example, it is possible to prepare pump circuits having different supplying abilities of the entire substrate bias voltage with only one design of the pump circuit, and there is an effect that it is possible to shorten a period of time during designing.

According to another aspect of the invention, the power source voltage to be supplied to all or a portion of the semiconductor device constituting the substrate bias voltage generating circuit is switched in accordance with the plurality of different detection signals. Therefore, the supplying ability of the substrate bias voltage can be changed, and there is an effect that a size of the circuit, current consumption and a period of time during designing can be reduced.

According to another aspect of the invention, the plurality of detector circuits commonly use one trimming circuit. Therefore, it is unnecessary that each of the detector circuits is provided with a different trimming circuit, and there is an effect that it is possible to reduce the circuit size and to enhance the yield.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A substrate bias voltage generating circuit comprising:
   a plurality of detector circuits, each of which receives a substrate bias voltage, compares the substrate bias voltage with a threshold specific for that particular detector circuit, and outputs a detection signal when the substrate bias voltage is larger than the threshold and outputs a non-detection signal when the substrate bias voltage does not exceed the threshold;
   a ring oscillator circuit which generates and outputs an oscillation voltage based on the detection signals output by said detector circuits;
   a pump circuit which generates the substrate bias voltage based on the oscillation voltage output from said ring oscillator circuit; and
   a trimming circuit commonly connected to said plurality of detector circuits.

2. The substrate bias voltage generating circuit according to claim 3, wherein said ring oscillator circuit comprises:
   a plurality of ring oscillators, one ring oscillator being provided for each of said detector circuits, each of said ring oscillators receiving the detection signal and the non-detection signal from the corresponding detector circuit, and outputting an oscillation voltage in response to the detection signal and not outputting the oscillation voltage in response to the non-detection signal; and
   a selector which receives the oscillation voltages output by each of said ring oscillators, receives the detection signal from at least one of said detector circuits, and selectively outputs one oscillation voltage based on the detection signal, said pump circuit generating the substrate bias voltage based on the oscillation voltage output from said selector.

3. The substrate bias voltage generating circuit according to claim 1, wherein said ring oscillator circuit is activated in accordance with the detection signals and said pump circuit generates the substrate bias voltage for switching a powering voltage that is applied to at least some of semiconductor devices constituting the substrate bias voltage generating circuit, in accordance with the detection signals.

4. A substrate bias voltage generating circuit comprising:
a plurality of detector circuits, each of which receives a substrate bias voltage, compares the substrate bias voltage with a threshold specific for that particular detector circuit, and outputs a detection signal when the substrate bias voltage is larger than the threshold and outputs a non-detection signal when the substrate bias voltage does not exceed the threshold;
a ring oscillator circuit which generates and outputs an oscillation voltage based on the detection signals output by said detector circuits, including
  an oscillation voltage generator which generates the oscillation voltage;
  a frequency divider which divides frequency of the oscillation voltage by a frequency division rate based on the detection signals output by said detector circuits; and
  a selector which outputs any one of the oscillation voltage and a frequency divided oscillation voltage divided by said frequency divider in accordance with the detection signals output by said detector circuits; and
a pump circuit which generates the substrate bias voltage based on the oscillation voltage output from said ring oscillator circuit.

5. A substrate bias voltage generating circuit comprising:
a plurality of detector circuits, each of which receives a substrate bias voltage, compares the substrate bias voltage with a threshold specific for that particular detector circuit, and outputs a detection signal when the substrate bias voltage is larger than the threshold and outputs a non-detection signal when the substrate bias voltage does not exceed the threshold;
a ring oscillator circuit which generates and outputs an oscillation voltage based on the detection signals output by said detector circuits;
a pump circuit which generates the substrate bias voltage based on the oscillation voltage output from said ring oscillator circuit; and
a plurality of delay groups, wherein said ring oscillator circuit changes said delay groups connected in accordance with the detection signals to output the oscillation voltage.

6. A substrate bias voltage generating circuit comprising:
a plurality of detector circuits, each of which receives a substrate bias voltage, compares the substrate bias voltage with a threshold specific for that particular detector circuit, and outputs a detection signal when the substrate bias voltage is larger than the threshold and outputs a non-detection signal when the substrate bias voltage does not exceed the threshold;
a ring oscillator circuit which generates and outputs an oscillation voltage based on the detection signals output by said detector circuits;
a pump circuit which generates the substrate bias voltage based on the oscillation voltage output from said ring oscillator circuit; and
at least one delay group and at least one transistor which supplies a current to said at least one delay group, wherein said ring oscillator circuit includes a current limiting ring oscillator that ON/OFF controls said at least one transistor in accordance with the detection signals to output the oscillation voltage.

7. The substrate bias voltage generating circuit according to claim 6, further comprising a plurality of said delay groups and a plurality of said transistors which control magnitude of currents supplied to said plurality of delay groups respectively, wherein said ring oscillator circuit ON/OFF controls at least some of said plurality of transistors, in accordance with the detection signals, to output the oscillation voltage.

8. A substrate bias voltage generating circuit comprising:
a plurality of detector circuits, each of which receives a substrate bias voltage, compares the substrate bias voltage with a threshold specific for that particular detector circuit, and outputs a detection signal when the substrate bias voltage is larger than the threshold and outputs a non-detection signal when the substrate bias voltage does not exceed the threshold;
a ring oscillator circuit which generates and outputs an oscillation voltage based on the detection signals output by said detector circuits;
a pump circuit which generates the substrate bias voltage based on the oscillation voltage output from said ring oscillator circuit; and
at least one delay group and at least one transistor which supplies a current to said at least one delay group, wherein said ring oscillator circuit includes a current limiting ring oscillator and controls a gate voltage of said at least one transistor in accordance with the detection signals, to output the oscillation voltage.

9. A substrate bias voltage generating circuit comprising:
a plurality of detector circuits, each of which receives a substrate bias voltage, compares the substrate bias voltage with a threshold specific for that particular detector circuit, and outputs a detection signal when the substrate bias voltage is larger than the threshold and outputs a non-detection signal when the substrate bias voltage does not exceed the threshold;
a ring oscillator circuit which generates and outputs an oscillation voltage based on the detection signals output by said detector circuits;
a pump circuit which generates the substrate bias voltage based on the oscillation voltage output from said ring oscillator circuit; and
at least one delay group and at least one capacitor, wherein said ring oscillator circuit cuts off said at least one capacitor connected to said at least one delay group in accordance with the detection signals to output the oscillation voltage.

10. The substrate bias voltage generating circuit according to claim 9, wherein said ring oscillator circuit comprises a plurality of said delay groups and a plurality of said capacitors, wherein said ring oscillator circuit cuts off at least some of said capacitors connected to said delay groups in accordance with the detection signals, to output the oscillation voltage.

11. The substrate bias voltage generating circuit according to claim 9, including a respective fuse connecting said at least one capacitor to said at least one delay group, for laser trimming.

12. A substrate bias voltage generating circuit comprising:
a plurality of detector circuits, each of which receives a substrate bias voltage, compares the substrate bias voltage with a threshold specific for that particular detector circuit, and outputs a detection signal when the substrate bias voltage is larger than the threshold and outputs a non-detection signal when the substrate bias voltage does not exceed the threshold;
a ring oscillator circuit which generates and outputs an oscillation voltage based on the detection signals output by said detector circuits;

a pump circuit which generates the substrate bias voltage based on the oscillation voltage output from said ring oscillator circuit; and a plurality of semiconductor elements, wherein said ring oscillator circuit changes a powering voltage that is applied to at least some of said semiconductor elements in accordance with the detection signals, to output the oscillation voltage.

13. A substrate bias voltage generating circuit comprising:

a plurality of detector circuits, each of which receives a substrate bias voltage, compares the substrate bias voltage with a threshold specific for that particular detector circuit, and outputs a detection signal when the substrate bias voltage is larger than the threshold and outputs a non-detection signal when the substrate bias voltage does not exceed the threshold;

a ring oscillator circuit which generates and outputs an oscillation voltage based on the detection signals output by said detector circuits, is activated in accordance with the detection signals;

a plurality of pump circuits which together generate the substrate bias voltage based on the oscillation voltage; and a selector which selectively inputs the oscillation voltage output from said ring oscillator circuit to said plurality of pump circuits in accordance with the detection signals.

14. The substrate bias voltage generating circuit according to claim 13, wherein said plurality of pump circuits have a module structure in which the pump circuits having identical substrate bias voltage supplying abilities are connected in parallel.

15. The substrate bias voltage generating circuit according to claim 13, including a trimming circuit commonly connected to said plurality of detector circuits.

* * * * *